(12) United States Patent
Tsunekawa

(10) Patent No.: US 8,118,981 B2
(45) Date of Patent: Feb. 21, 2012

(54) SPUTTERING APPARATUS AND METHOD FOR CONTROLLING THE SAME

(75) Inventor: Koji Tsunekawa, Hachioji (JP)

(73) Assignee: Canon Anelva Corporation, Kawasaki-shi (JP)

( * ) Notice: Subject to any disclaimer, the term of this patent is extended or adjusted under 35 U.S.C. 154(b) by 466 days.

(21) Appl. No.: 12/369,453

(22) Filed: Feb. 11, 2009

(65) Prior Publication Data

US 2009/0211897 A1  Aug. 27, 2009

(30) Foreign Application Priority Data

Feb. 21, 2008 (JP) ................................. 2008-039784

(51) Int. Cl.
*C23C 14/34* (2006.01)
*C23C 16/00* (2006.01)

(52) U.S. Cl. .............................. 204/192.13; 204/298.07

(58) Field of Classification Search ............. 204/192.12, 204/192.13, 298.11, 298.26, 298.28
See application file for complete search history.

(56) References Cited

U.S. PATENT DOCUMENTS

| | | | |
|---|---|---|---|
| 6,641,703 B2 | 11/2003 | Nomura et al. | |
| 2004/0231595 A1* | 11/2004 | Takeuchi et al. | 118/721 |
| 2005/0199490 A1 | 9/2005 | Nomura et al. | 204/298.11 |
| 2009/0139865 A1 | 6/2009 | Nomura et al. | 204/298.28 |

FOREIGN PATENT DOCUMENTS

JP  2005-256112  9/2005

OTHER PUBLICATIONS

Saito, M., et al., "Exchange Coupling Between Antiferromagnetic PtMn and Ferromagnetic Films," The Journal of the Magnetics Society of Japan, vol. 21, No. 4-2, pp. 505-508 (1997).

* cited by examiner

*Primary Examiner* — Stephen Rosasco
(74) *Attorney, Agent, or Firm* — Fitzpatrick, Cella, Harper & Scinto

(57) ABSTRACT

The present invention provides a multi-target sputtering apparatus including an increased number of targets which can be sputtered simultaneously, and a method for controlling the sputtering apparatus. In one embodiment of the present invention, first and second shutter plates are provided between a substrate and target electrodes and paths between intended targets and the substrate are shut off by the shutter plates to perform a pre-sputtering step. In addition, the first and second shutter plates are rotated as appropriate at the time of transition to a full-scale sputtering step, so as to overlap through-holes provided in the shutter plates, thereby opening up paths between the intended targets and the substrate. Then, a full-scale sputtering step is performed.

13 Claims, 19 Drawing Sheets

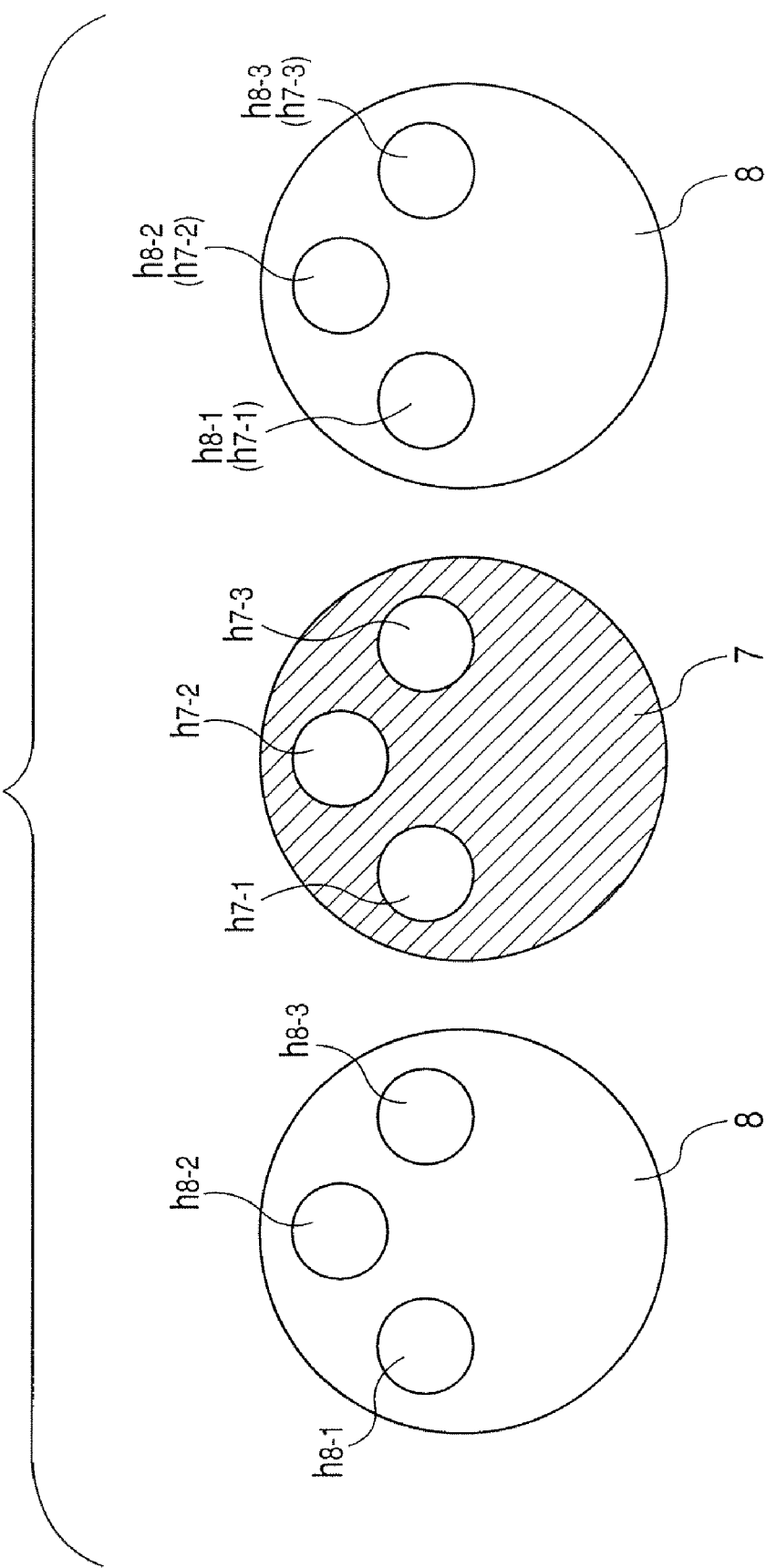

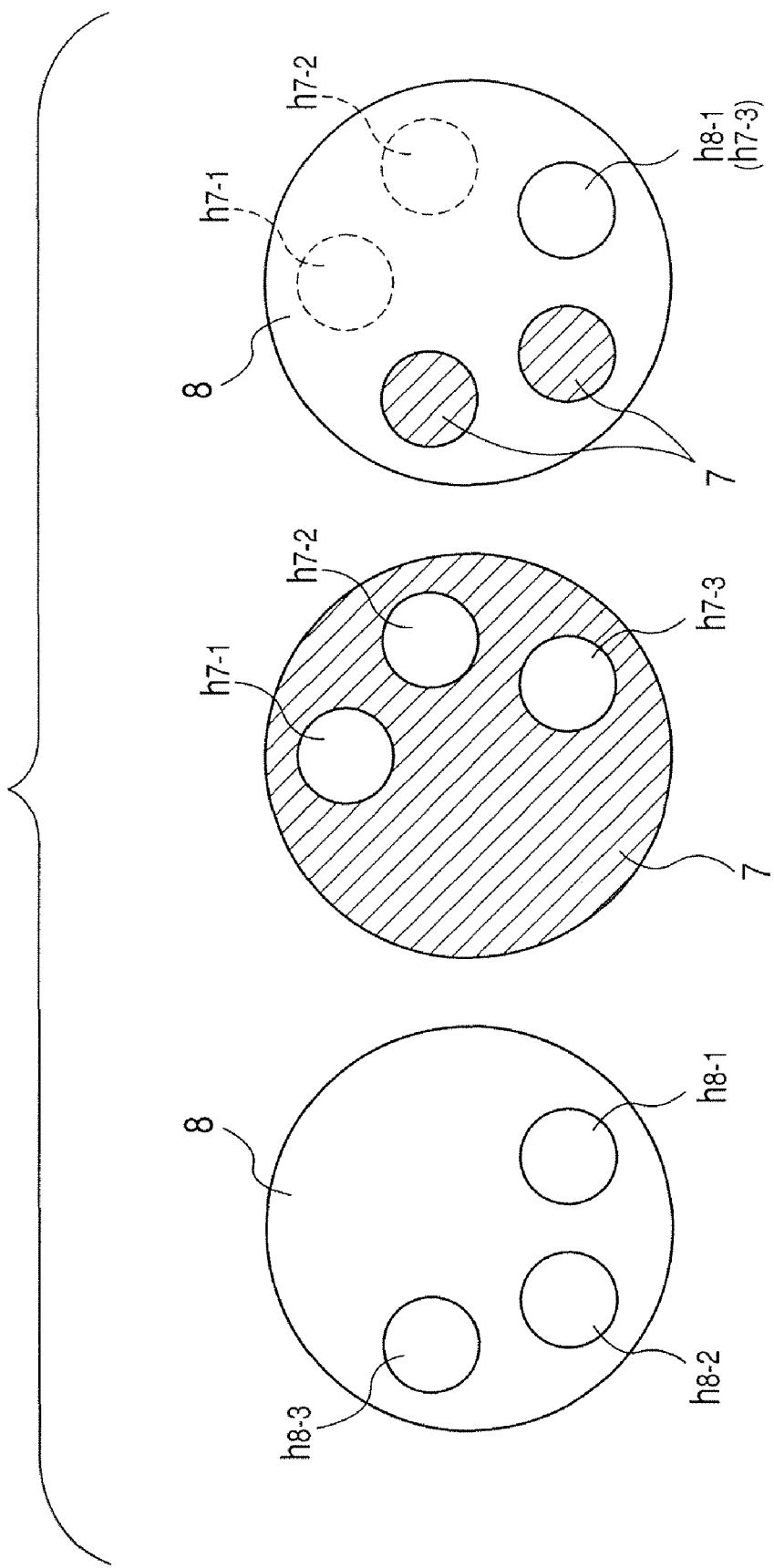

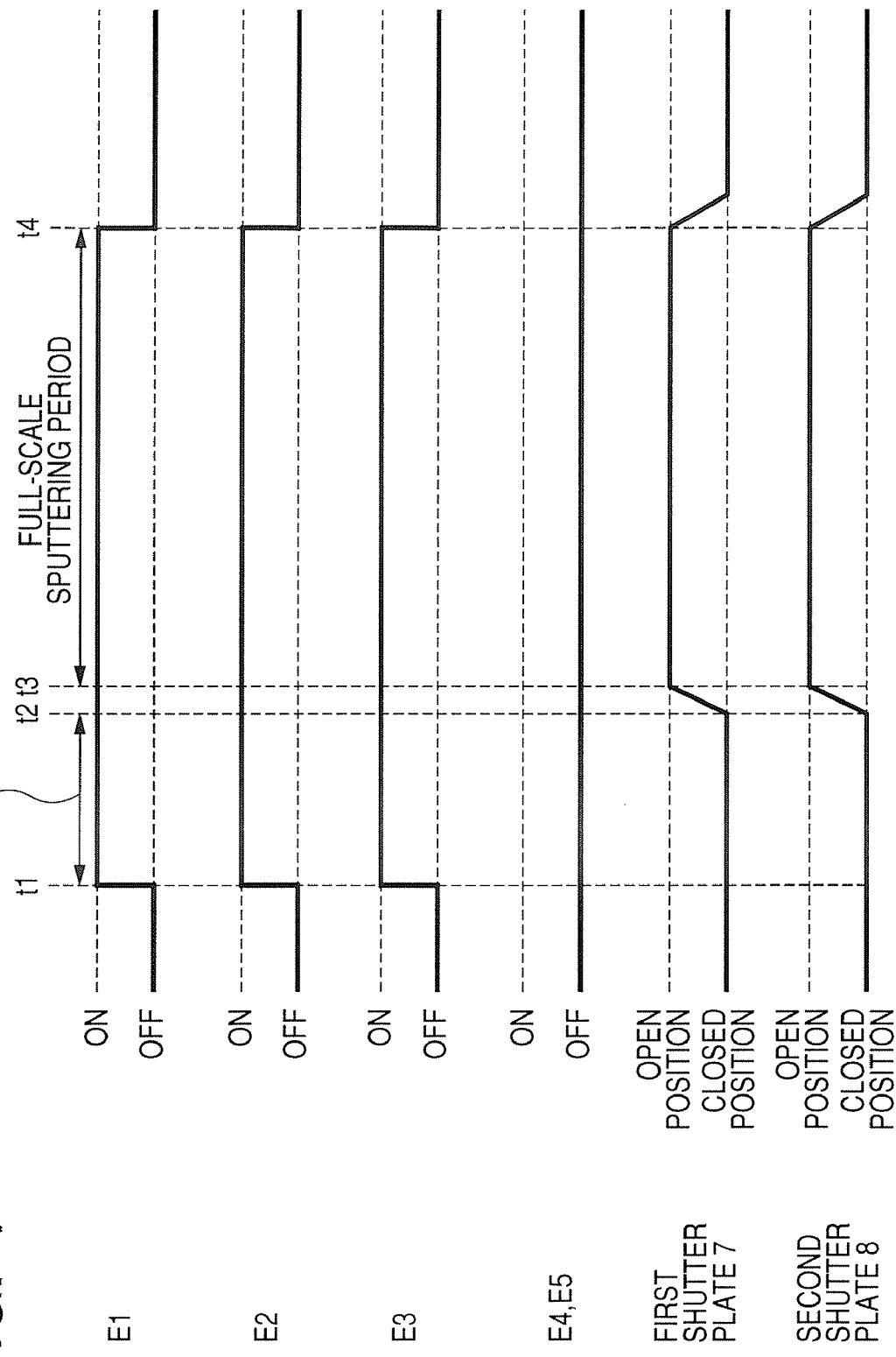

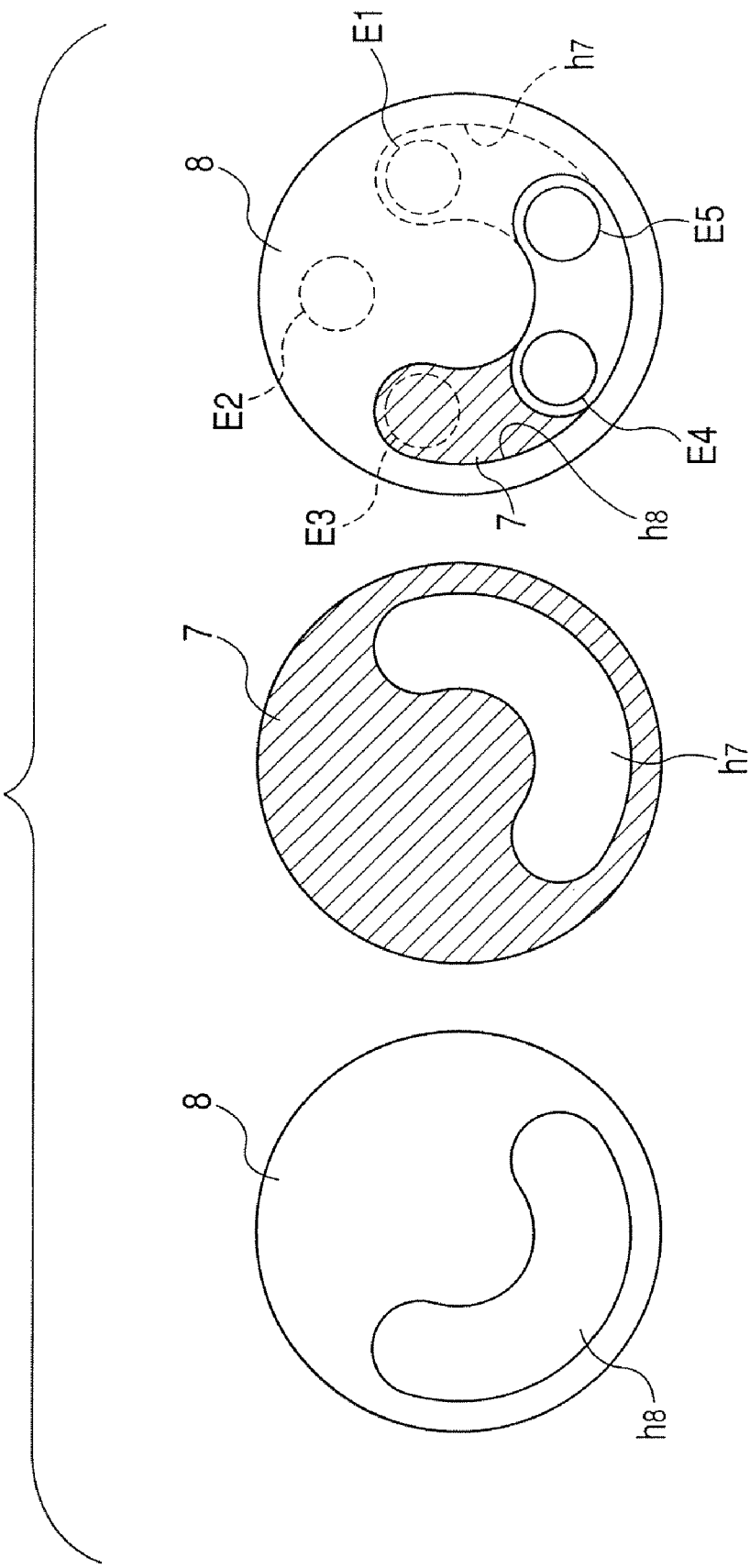

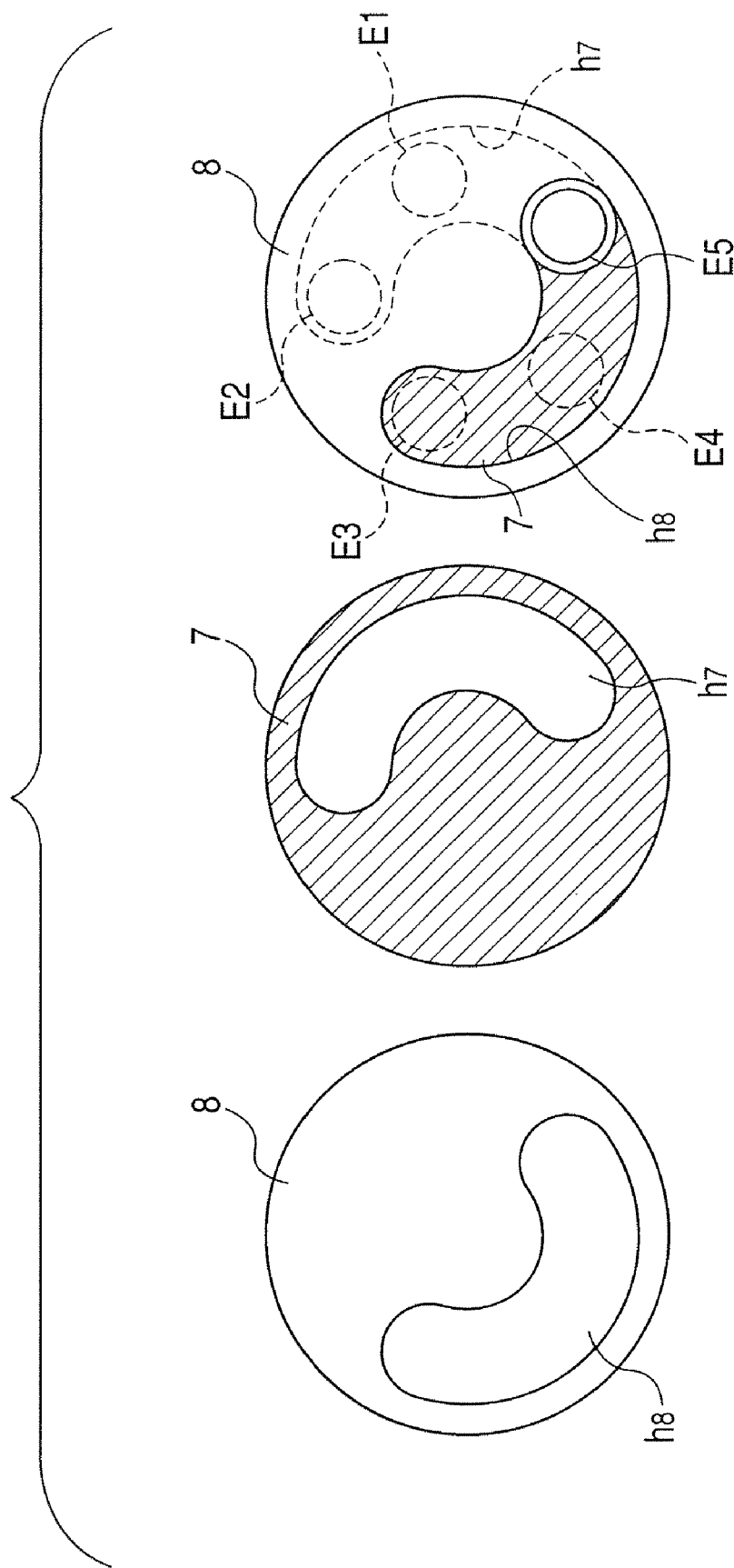

SPUTTERING APPARATUS AND METHOD FOR CONTROLLING THE SAME

CROSS-REFERENCES TO RELATED APPLICATIONS

This application claims the benefit of priority from Japanese Patent Application No. 2008-039784 filed Feb. 21, 2008, the entire contents of which is incorporated herein by reference.

BACKGROUND OF THE INVENTION

1. Field of the Invention

The present invention relates to a sputtering apparatus for forming thin films on a semiconductor substrate such as silicon, or on a substrate of metal, glass, ceramics, plastics or the like, in vacuum in a manufacturing process of a semiconductor device or an electronic device, and to a method for controlling the sputtering apparatus.

2. Related Background Art

In modern semiconductor devices and electronic devices, a complex alloy, compound or mixture has come into use for a material playing a central role along with the improvement of device performance. For a thin film composed of such a material, there has been conventionally used a target and a deposition material of a similar composition to a desired thin-film material in a physical vapor deposition (PVD) method, such as a sputtering method and a vapor deposition method. However, the composition of the formed thin film often deviates from the composition of the target or the deposition material in the PVD method. Since the device characteristics of modern devices are extremely sensitive to the composition of those thin-film materials, there has been the need to discover a target or a deposition material whereby the desired composition can be obtained, if a compositional deviation occurs.

In order to seek for a new thin-film material, device characteristics are evaluated while varying the composition of a thin film. In such work, a vacuum apparatus is exposed to the atmosphere each time and a compositionally different target or deposition material is attached to the apparatus to perform film-forming. Thus, the work has required extra development costs and a prolonged period of time. In order to cut such development costs, the Journal of the Magnetics Society of Japan, Vol. 21, No. 4, pp. 505-508 (1997) discloses a method in which Pt pellets are attached to an Mn target to provide a target at the time of forming a Pt—Mn alloy thin film, and the composition of the thin film is adjusted by varying the number of Pt pellets. According to this method, there is no need to prepare a plurality of compositionally different Pt—Mn targets, it is possible to reduce development costs. In order to perform the work of attaching Pt pellets, however, the vacuum apparatus needs to be exposed to the atmosphere each time. The method therefore does not lead to the reduction of development time.

In contrast, as a sputtering method capable of making the composition adjustment of a target or a deposition material without the need for the atmospheric exposure of apparatus, there is a multi-target co-sputtering method in which a plurality of sputtering cathodes are discharged simultaneously. Japanese Patent Application Laid-Open No. 2005-256112 discloses a multi-target sputtering method using a double rotary shutter in which two shutters, each having two openings, are arranged one on top of the other, in order to perform two-target co-sputtering. In the method, desired two cathodes are selected with one shutter and open/close operations are performed with the other shutter, in order to shift from a pre-sputtering step to a full-scale sputtering step, thereby performing two-target co-sputtering. In a case where a Pt—Mn thin film is formed, it is possible to adjust the composition of the thin film by preparing a Pt target and an Mn target and varying power applied to each target. Accordingly, it is possible to significantly reduce the cost and time of developing compositionally different thin films.

In the method disclosed in Japanese Patent Application Laid-Open No. 2005-256112, however, the combination of targets, and the number of targets that can be sputtered simultaneously, have been limited since one shutter plate is fixed as a shutter for cathode selection and the other shutter plate is used for open/close operations. Specifically, only two targets can be sputtered simultaneously in a sputtering apparatus in which five targets are arranged.

SUMMARY OF THE INVENTION

An object of the present invention is to provide a multi-target sputtering apparatus including an increased number of targets that can be sputtered simultaneously, and a method for controlling the sputtering apparatus.

A first aspect of the present invention is a sputtering apparatus comprising, within the vacuum chamber thereof, a plurality of target electrodes capable of holding targets and a shut-off device capable of shutting off paths between said target electrodes and a substrate being processed, wherein said plurality of target electrodes are arranged on the same circumference centered on a line perpendicular to and passing through the center of the to-be-treated surface of said substrate being processed, said shut-off device including: first and second shutter plates that overlap with each other and rotate around the center of the same circumference on which said plurality of target electrodes are arranged; first and second drive means for rotating said first and second shutter plates independently of each other; and a drive control means for controlling said first and second drive means; wherein each of said first and second shutter plates has at least one opening for uncovering at least one target electrode to said substrate being processed and has a shape adapted to shut off a path between at least one target electrode and said substrate being processed, said drive control means can control said first and second drive means so as to rotate said first and second shutter plates independently of each other and, by the positional combination of the openings of said first and second shutter plates, can uncover an arbitrary number of target electrodes, among numbers allowed by said combination, to said substrate being processed, and at the time of sputter processing in which sputtering is performed by opening up paths between targets to be sputtered and said substrate, said drive control means controls said first and second drive means to rotate said first and second shutter plates independently of each other according to the number of targets to be sputtered and the arrangement thereof, so as to uncover said targets to be sputtered to said substrate being processed through regions in which openings of said first and second shutter plates overlap with each other, so that all of said targets to be sputtered are uncovered to said substrate being processed.

A second aspect of the present invention is a method for controlling a sputtering apparatus comprising, within the vacuum chamber thereof, a plurality of target electrodes capable of holding targets and a shut-off device capable of shutting off paths between said target electrodes and a substrate being processed, said plurality of target electrodes being arranged on the same circumference centered on a line perpendicular to and passing through the center of the to-betreated surface of said substrate being processed, said shut-off device including first and second shutter plates that overlap with each other and rotate around the center of the same circumference on which said plurality of target electrodes are arranged and first and second drive means for rotating said first and second shutter plates independently of each other, each of said first and second shutter plates having a plurality of openings for uncovering at least one target electrode to said substrate being processed and having a shape adapted to shut off a path between at least one target electrode and said substrate being processed, wherein said control method can control said first and second drive means so as to rotate said first and second shutter plates independently of each other and, by the positional combination of the openings of said first and second shutter plates, can uncover an arbitrary number of target electrodes, among numbers allowed by said combination, to said substrate being processed, and at the time of sputter processing in which sputtering is performed by opening up paths between targets to be sputtered and said substrate, said control method controls said first and second drive means to rotate said first and second shutter plates independently of each other according to the number of targets to be sputtered and the arrangement thereof, so as to uncover said targets to be sputtered to said substrate being processed through regions in which openings of said first and second shutter plates overlap with each other, so that all of said targets to be sputtered are uncovered to said substrate being processed.

In the present invention, since the first and second shutter plates are rotated independently of each other, the degree of freedom of combining targets is increased, and thus, it is possible to increase the number of targets to be sputtered simultaneously. Accordingly, by using a sputtering apparatus of the present invention, it is possible to carry out the composition adjustment of thin films and the development of novel thin-film materials at even lower costs and in an even shorter period of time in a process of manufacturing a semiconductor device or an electronic device.

BRIEF DESCRIPTION OF THE DRAWINGS

FIG. 4A is a schematic plan view illustrating first and second shutter plates and a state of these shutter plates being stacked one on top of the other, in accordance with the present invention.

FIG. 4C is yet another schematic plan view illustrating the first and second shutter plates and a state of these shutter plates being stacked one on top of the other, in accordance with the present invention.

FIG. 7 is a timing chart showing a relationship between the on-off states of target electrode voltages and the open and closed positions of the first and second shutter plates in a pre-sputtering step and in a full-scale sputtering step.

FIG. 9B is another schematic plan view illustrating an example of the shapes of shutter plates in accordance with the present invention.

FIG. 9C is yet another schematic plan view illustrating an example of the shapes of shutter plates in accordance with the present invention.

DESCRIPTION OF THE PREFERRED EMBODIMENTS

A sputtering apparatus of the present invention includes, within the vacuum chamber thereof, a plurality of target electrodes and a shut-off device capable of shutting off paths between the target electrodes and a substrate being processed. In addition, this shut-off device includes first and second shutter plates, first and second drive means for rotating the two shutter plates independently of each other, and a drive control means for controlling the first and second drive means.

Hereinafter, the sputtering apparatus of the present invention will be described in detail by referring to embodiments.

Figure 1:
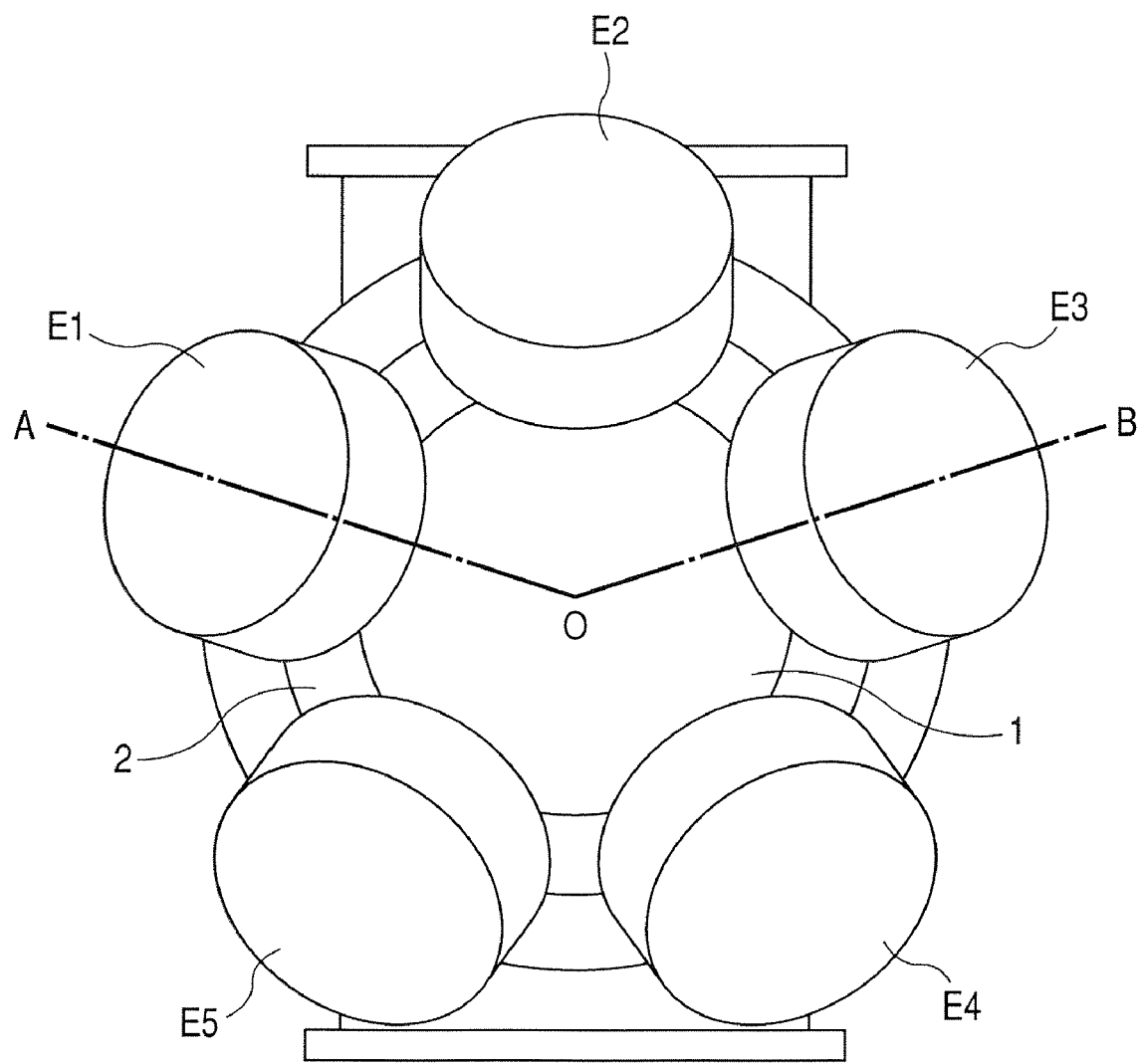
FIG. 1 is a schematic plan view illustrating an arrangement of target electrodes of a sputtering apparatus in accordance with one preferred embodiment of the present invention.
Figure 2:
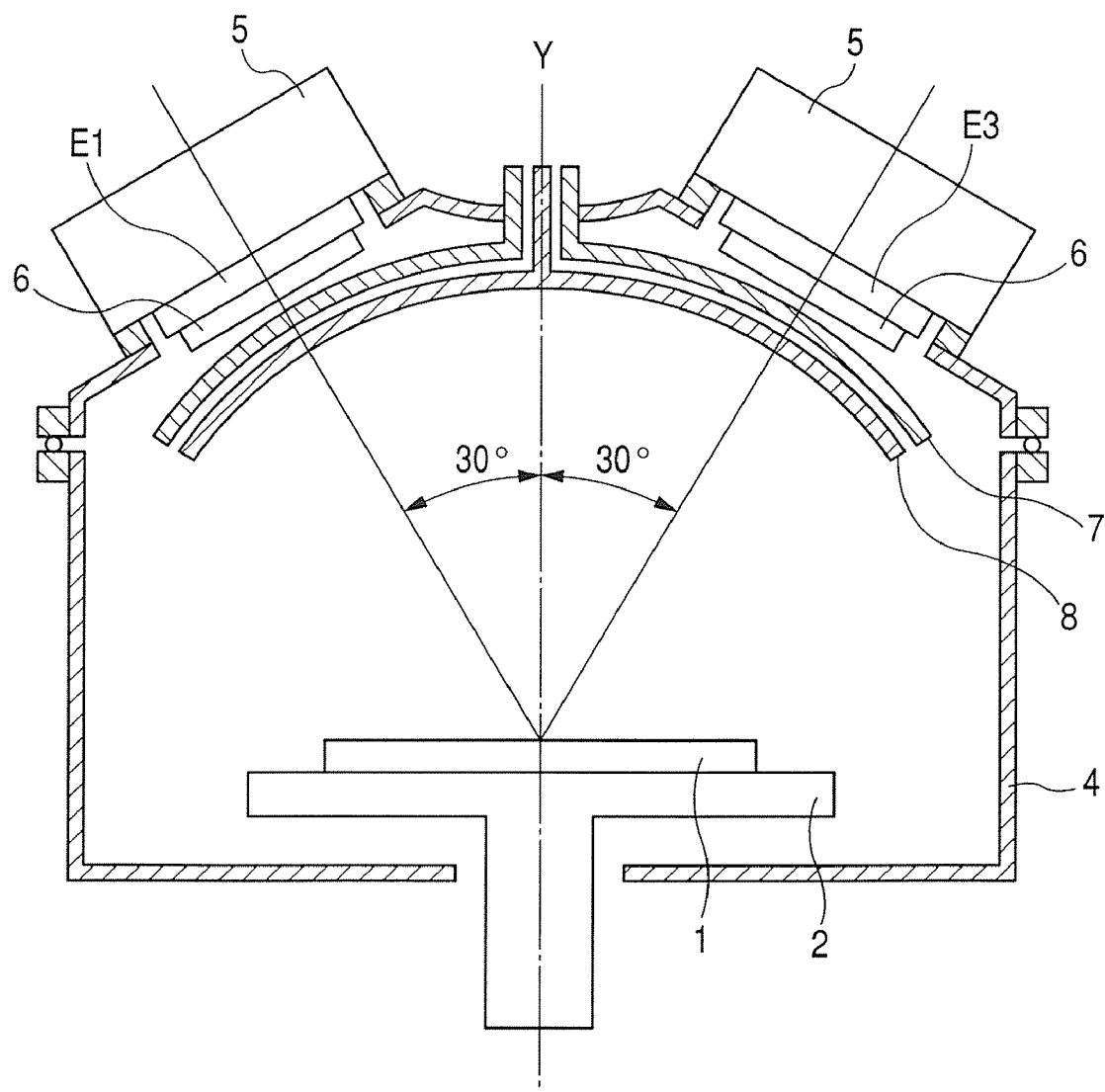
FIG. 2 is a schematic cross-sectional view corresponding to the cross section AOB of FIG. 1.

FIG. 1 is a schematic plan view illustrating an arrangement of target electrodes of a sputtering apparatus in accordance with one preferred embodiment of the present invention, whereas FIG. 2 is a schematic cross-sectional view corresponding to the cross section AOB of FIG. 1. In the figures, reference symbols E1 to E5 denote target electrodes, reference numeral 1 denotes a substrate being processed, reference numeral 2 denotes a substrate stage, reference numeral 4 denotes a vacuum chamber, reference numeral 5 denotes a target holder, reference numeral 6 denotes a target, reference numeral 7 denotes a first shutter plate, and reference numeral 8 denotes a second shutter plate.

As shown in FIGS. 1 and 2, the sputtering apparatus of the present invention includes the substrate stage 2, on which the substrate being processed 1 is mounted, and the plurality of target electrodes E1 to E5 arranged above the substrate stage 2.

A dry pump and a cryopump for evacuation and a gas inlet for introducing a discharge gas, such as an Ar gas, are connected to the vacuum chamber 4 (none of which is illustrated). During a sputtering step, the substrate stage 2 rotates around a normal line Y passing through the center of the to-be-treated surface of the substrate 1, with the substrate 1 mounted thereon, as driven by a driving device (not illustrated). Note that, as the driving device of the substrate stage 2, there is used, for example, a motor in which a magnetic fluid seal is interposed between the rotational axis and the stator thereof.

The target electrodes E1 to E5 are cathodes provided with target holders 5 on which targets can be mounted. The target electrodes E1 to E5 are respectively connected to DC power sources for plasma generation. As a result of independently-regulated electric power being input to each target electrode, plasma is generated from the discharge gas introduced into the vacuum chamber 4. Consequently, targets 6 attached to the electrified target electrodes E1 to E5 are sputtered. Note that targets 6 need not be mounted on all of the target electrodes E1 to E5. Alternatively, it is possible to mount targets 6 to some of the target electrodes and then sputter the targets. Hereinafter, a combination of target electrodes mounted with targets 6 is referred to as a "target arrangement."

Figure 10:
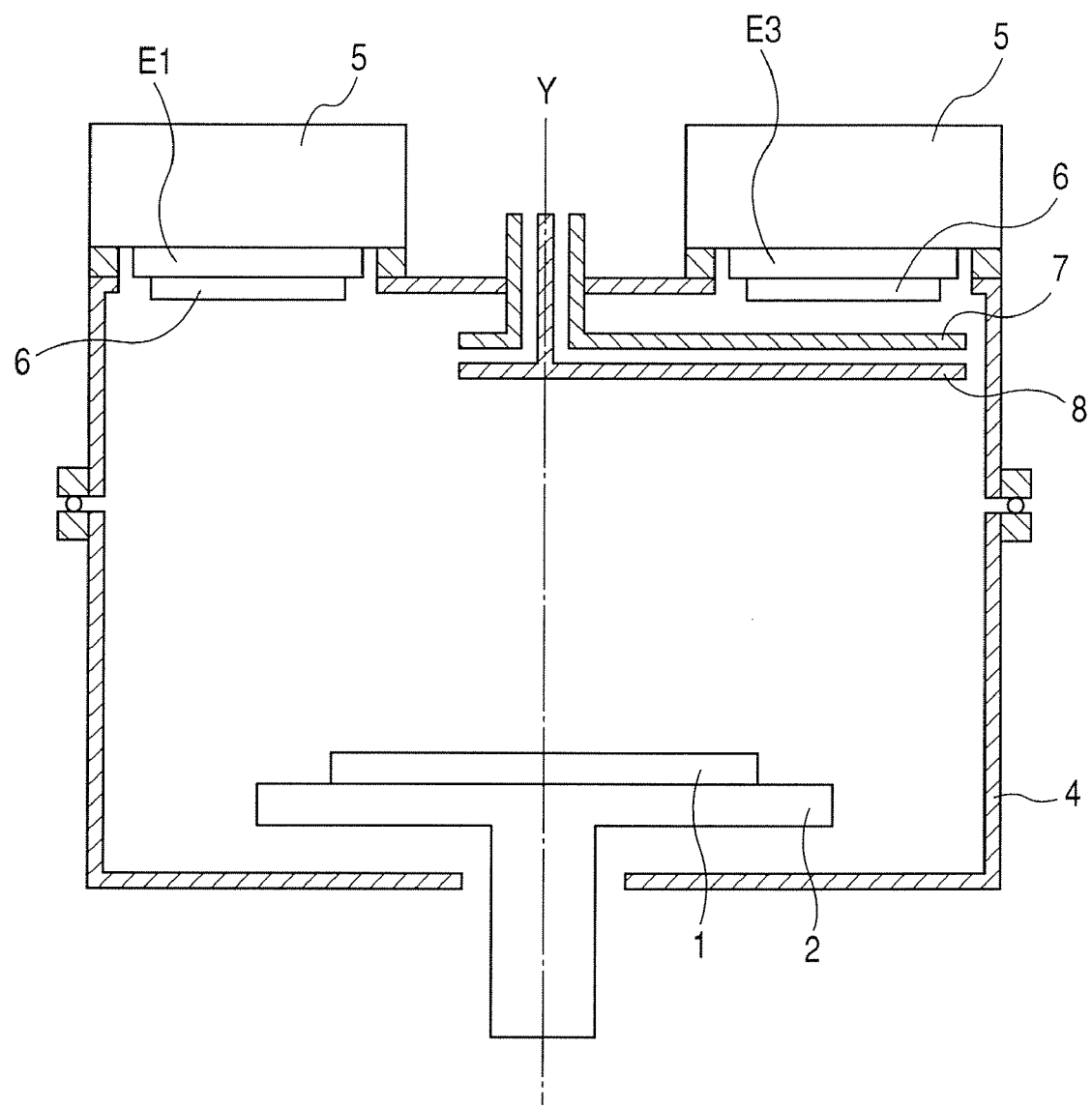
FIG. 10 is a schematic cross-sectional view of a sputtering apparatus in another embodiment of the present invention.

In addition, the plurality of target electrodes are arranged at equal spaces on the same circumference centered on the rotational axis Y of the substrate stage 2. Since there are five target electrodes E1 to E5 in the present embodiment, the target electrodes are arranged at an equal angular space of 72°. Furthermore, in the present embodiment, each target electrode is angled so as to face the center of the substrate 1. More specifically, each target electrode is arranged so that the normal line of the surface thereof for holding targets is angled at 30° with respect to the normal line Y of the to-be-treated surface of the substrate. The tilt angle is set within the range of 2° to 60°, preferably 5° to 50°. However, as shown in FIG. 10, it is also possible to arrange each target electrode so as to be parallel with the substrate 1 (=tilt angle of 0°).

The sputtering apparatus in accordance with one embodiment of the present invention is provided with two shutter plates 7 and 8 rotatable independently of each other. The above-described two shutter plates 7 and 8 are independently controlled at the time of transition from a pre-sputtering step to a full-scale sputtering step, and are thereby repositioned. Here, the pre-sputtering step refers to a step of causing discharge with a path between the substrate 1 and a target 6 shut off with a shutter plate, whereas the full-scale sputtering step refers to a step of performing sputtering with the path between the substrate 1 and the target 6 opened up.

The first and second shutter plates 7 and 8 in accordance with the present invention includes openings adapted to a plurality of target electrodes, and have shapes adapted to shut off a path between at least one target electrode and the substrate 1. That is, the first and second shutter plates respectively have at least one opening for uncovering at least one target electrode to the substrate. In the present invention, the number of target electrodes is preferably 2n+1 ("n" is a natural number). On the other hand, the first and second shutter plates respectively have openings adapted to n+1 or more target electrodes. Thus, the maximum number of targets that can be sputtered simultaneously in the apparatus is n+1.

The number of target electrodes in the present embodiment is five and, therefore, the first and second shutter plates 7 and 8 respectively have openings adapted to three or four target electrodes. Thus, the maximum number of targets that can be sputtered simultaneously is three.

Figure 3:
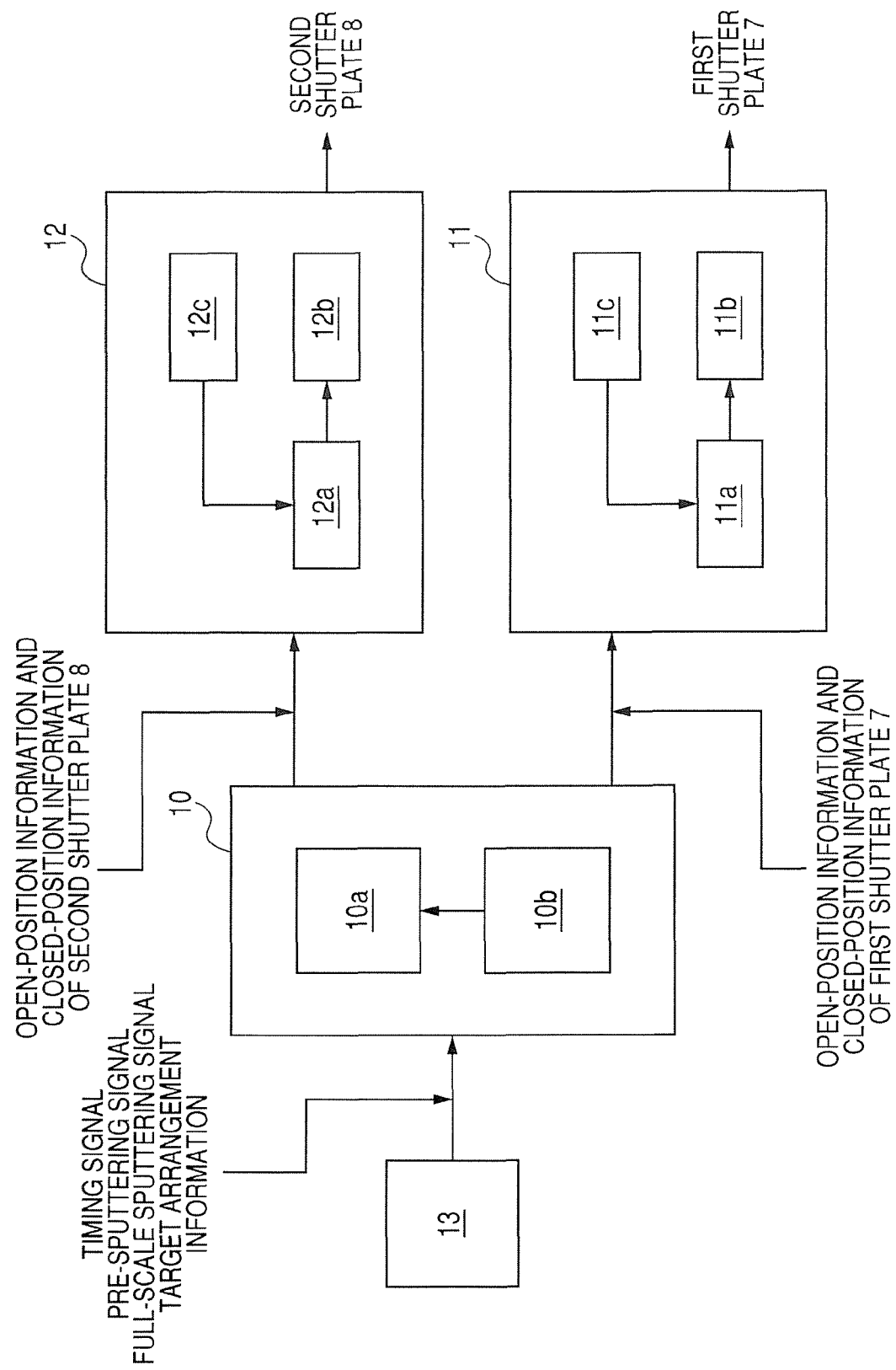
FIG. 3 is a schematic configuration diagram of the shut-off device of a sputtering apparatus of the present invention.

FIG. 3 shows a schematic configuration of a shut-off device. The shut-off device in accordance with one embodiment of the present invention shuts off a path between the substrate 1 and a target 6 in a pre-sputtering step and opens up the path between the substrate 1 and the target 6 in a full-scale sputtering step, as instructed by a controller for sputtering 13. Specifically, the shut-off device is provided with the first and second shutter plates 7 and 8 and the first second drive means 11 and 12 for rotating the first and second shutter plates 7 and 8 independently of each other. In addition, the shut-off device is provided with a drive control means (controller) 10 for controlling the drive means 11 and 12, so as to rotate the first and second shutter plates 7 and 8 to predetermined angles and place the respective openings in predetermined positions.

The first and second shutter plates 7 and 8 are arranged one on top of the other with the plate surfaces thereof facing the target electrodes E1 to E5. In addition, the rotational axis of both the shutter plates 7 and 8 is positioned coaxially with a rotational axis Y which is the rotating center of the substrate stage 2.

Figure 4B:
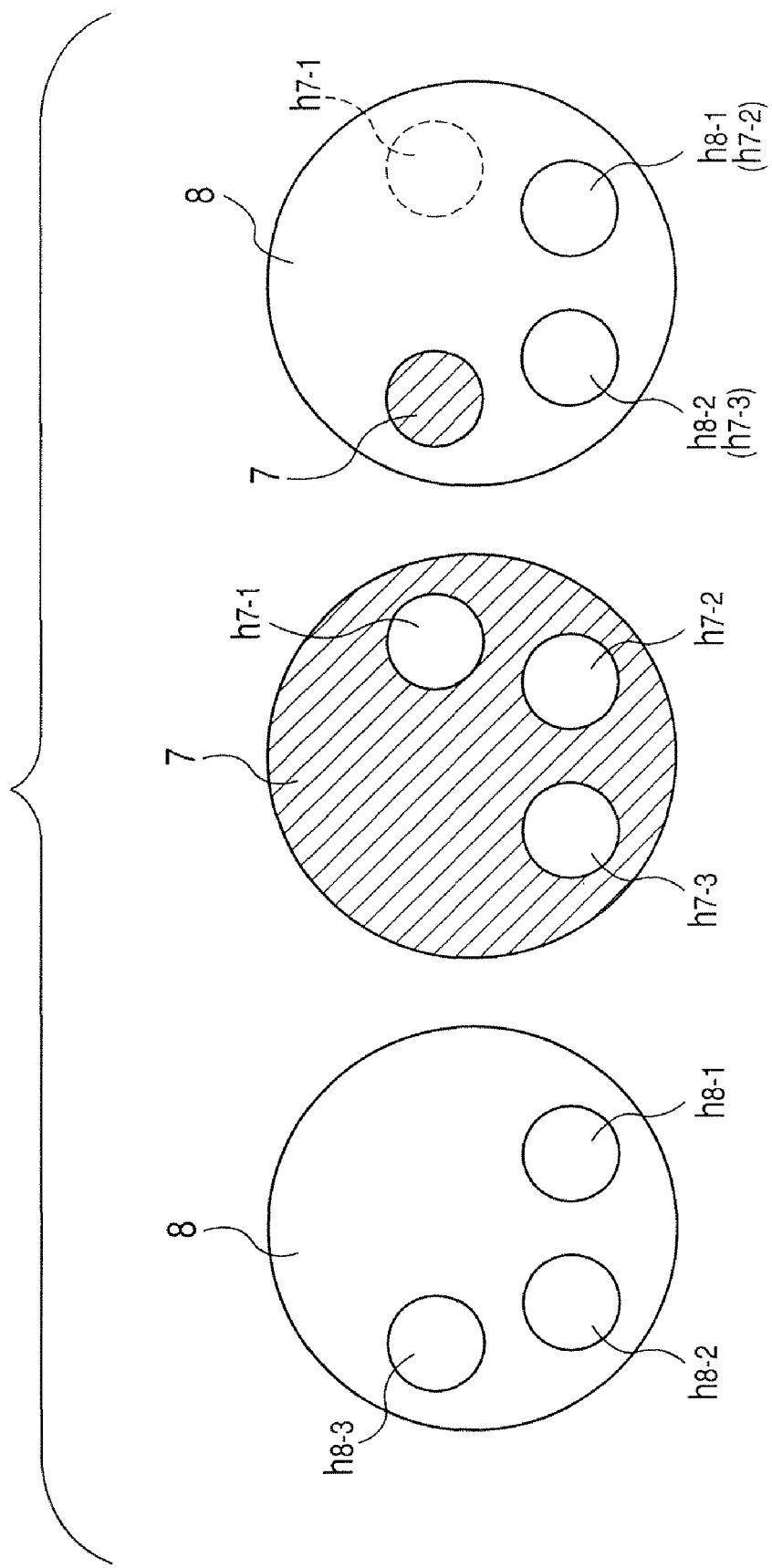
FIG. 4B is another schematic plan view illustrating the first and second shutter plates and a state of these shutter plates being stacked one on top of the other, in accordance with the present invention.

FIGS. 4A to 4C show plan views of one example of the first and second shutter plates 7 and 8. Symbol "h" in the figures denotes a through-hole (opening). The shutter plates of the present embodiment are adapted for use with an apparatus provided with five target electrodes. In each shutter plate, three through-holes h are formed at regular spaces on the same circumference. Each of through-holes $h_{7-1}$ to $h_{7-3}$ and $h_{8-1}$ to $h_{8-3}$ is larger in area than a single target electrode. Accordingly, the first and second shutter plates 7 and 8 are respectively arranged between the substrate 1 and the target electrodes, thereby opening up paths between three target electrodes and the substrate and shutting off paths between two target electrodes and the substrate. Since the first and second shutter plates 7 and 8 are arranged one on top of the other, it depends on the position of each of the through-holes $h_{7-1}$ to $h_{7-3}$ and $h_{8-1}$ to $h_{8-3}$ whether a path between the substrate 1 and a target electrode is opened up or shut off.

That is, since the first and second shutter plates 7 and 8 can be rotated independently of each other, the sputtering apparatus of the present invention makes it possible to freely select from the positional combinations of the through-holes $h_{7-1}$ to $h_{7-3}$ and $h_{8-1}$ to $h_{8-3}$ formed in the respective shutter plates within a range allowed by the combinations when carrying out sputter processing, such as pre-sputtering or full-scale sputtering. Consequently, it is possible to improve the degree of freedom of combining targets used in a full-scale sputtering step.

FIGS. 4A to 4C respectively show, from left to right, conditions in which the shutter plates 7 and 8 are stacked one on top of the other with the second shutter plate 8, the first shutter plate 7, and the second shutter plate 8 positioned on the substrate 1 side, and then viewed therefrom.

In FIG. 4A, the positions of the through-holes $h_{7-1}$ to $_{7-3}$ and $h_{8-1}$ to $h_{8-3}$ of the first and second shutter plates 7 and 8 are the same. Accordingly, under a condition in which the first and second shutter plates 7 and 8 are stacked one on top of the other, the through-holes $h_{7-1}$ and $h_{8-1}$, $h_{7-2}$ and $h_{8-2}$, and $h_{7-3}$ and $h_{8-3}$ respectively overlap with each other. Thus, paths between three target electrodes and the substrate 1 are opened up and paths between the remaining two target electrodes and the substrate 1 are shut off.

In FIG. 4B, the second shutter plate 8 is rotated to 72° with respect to the positions of the through-holes h of the first shutter plate 7, so as to be shifted one through-hole in a circumferential direction. Consequently, under a condition in which the two shutter plates 7 and 8 are stacked one on top of the other, each two through-holes $h_{7-2}$ and $h_{8-1}$ and $h_{7-3}$ and $h_{8-2}$ of the shutter plates overlap with each other, thereby opening up paths between two target electrodes and the substrate 1. One of the remaining three target electrodes is blocked by both the first and second shutter plates 7 and 8, whereas the other two target electrodes are blocked as a result of the through-hole $h_{7-1}$ or $h_{8-3}$ of either one of the first and second shutter plates 7 and 8 being shut off by the other shutter plate.

Furthermore, in FIG. 4C, the second shutter plate 8 is rotated to 144° with respect to the positions of the through-holes h of the first shutter plate 7, so as to be shifted one through-hole in the circumferential direction. Consequently, under a condition in which the two shutter plates 7 and 8 are stacked one on top of the other, only each one of the through-holes $h_{7-3}$ and $h_{8-1}$ of the respective shutter plates overlaps with the other one, thereby opening up a path between one target electrode and the substrate 1. Thus, paths between the remaining four target electrode and the substrate 1 are shut off either by the first shutter plate 7, by the second shutter plate 8, or by both the first and second shutter plates 7 and 8.

In the present invention, it is possible to adjust the number of target electrodes to be uncovered to the substrate 1 and the positions of the target electrodes by the rotational positions of the first and second shutter plates 7 and 8, as shown in FIGS. 4A to 4C. By positioning the through-holes according to a target arrangement, it is possible to carry out three-target co-sputtering.

The first and second drive means 11 and 12 are provided with motors 11b and 12b for driving the first and second shutter plates 7 and 8 independently of each other and encoders 11c and 12c for detecting the current positions of the shutter plates 7 and 8. The drive means 11 and 12 are further provided with drivers 11a and 12a for driving and controlling the shutter plates 7 and 8 to instructed values respectively input from the controller 10 on the basis of position information from the encoders 11c and 12c. Note that a magnetic fluid seal is interposed between the rotational axis and the stator of each of the motors 11b and 12b.

The controller 10 calculates the closed position or the open position of the first and second shutter plates 7 and 8 appropriate for the target arrangement, by following an instruction on the timing of transition to a pre-sputtering step or a full-scale sputtering step from the controller for sputtering 13. The controller 10 outputs the results of calculation to the drive means 11 and 12. The controller 10 is configured with, for example, a CPU, a RAM, a ROM, a clock pulse-generating circuit, and a microcomputer including a frequency divider, and realizes the above-described functions by program execution.

In the present embodiment, the controller 10 is provided with a table 10b that prescribes closed-position data (closed-position information) and open-position data (open-position information) for each target arrangement. The controller 10 is further provided with a position information-acquiring section 10a for acquiring the closed-position or open-position data of the shutter plates 7 and 8 appropriate for a target arrangement from the table 10b, in order to make the above-described calculation.

In the present specification, the "closed-position data (closed-position information)" refers to data (information) used to position through-holes formed in the shutter plates, so that a path between a target to be sputtered and the substrate is shut off by at least one of the first and second shutter plates 7 and 8, when the above-described target to be sputtered needs to be shut off from the substrate (for example, at the time of pre-sputtering step).

Note that in the present invention, the target to be sputtered and the substrate are shut off from each other as a result of two shutter plates, or the first and second shutter plates 7 and 8, being arranged. Consequently, all of targets to be sputtered may not be shut off simply by controlling the first shutter plate 7 (second shutter plate 8) according to first closed-position data (second closed-position data) transmitted to the first shutter plate 7 (second shutter plate 8). In the present invention, however, the two shutter plates are controlled independently of each other by transmitting dedicated closed-position data to each of the two shutter plate, so that all of targets to be sputtered are shut off from the substrate based on the interrelationship between the two shutter plates. Accordingly, even in such a case as described above, it is possible to realize the above-described shut-off as a result of arranging the two shutter plates.

The "open-position data (open-position information)" refers to data (information) used to position the above-described through-holes, so that a target to be sputtered is uncovered to the substrate through both through-holes formed in the first and second shutter plates 7 and 8, when the above-described target to be sputtered needs to be uncovered (exposed) to the substrate (for example, at the time of full-scale sputtering step).

In the present invention, it is possible to adjust the number of targets to be sputtered simultaneously by varying a combination of overlaps in the through-holes of the two shutter plates. Furthermore, it is possible to uncover a desired target or targets to the substrate by varying the positions of the through-holes by the rotation of the shutter plates, irrespective of the positions of targets to be sputtered. In order to exercise these advantageous effects, in the present invention, dedicated open-position data is transmitted to each of the two shutter plates to control the two shutter plates independently of each other. That is, it is possible to realize overlaps in the through-holes of the respective first and second shutter plates 7 and 8 at correct positions and with a correct number of overlaps, according to the interrelationship between the first shutter plate 7 rotation-controlled and positioned by the first open-position data and the second shutter plate 8 rotation-controlled and positioned by the second open-position data.

In the present invention, as described above, the table 10b correlates corresponding closed-position data and open-position data with each arrangement of targets to be sputtered (for example, each of the arrangements of the targets to be sputtered represented as (E1, E2, E3), (E3, E4, E5), (E2, E4), ...). Consequently, the controller 10 can acquire closed-position data and open-position data appropriate for the arrangement of the above-described targets to be sputtered, on the basis of target arrangement information on the arrangement of the above-described targets to be sputtered input from the controller for sputtering 13. Note that when a user inputs information on targets to be sputtered through an unillustrated input operation unit, such as a keyboard or a touch-sensitive panel, the controller for sputtering 13 accepts the input and can generate information that identifies the targets to be sputtered (information that shows which target is an object of sputtering; target arrangement information). In this target arrangement information, it is possible to include information on the number of targets to be sputtered and the arrangement thereof.

Figure 5A:
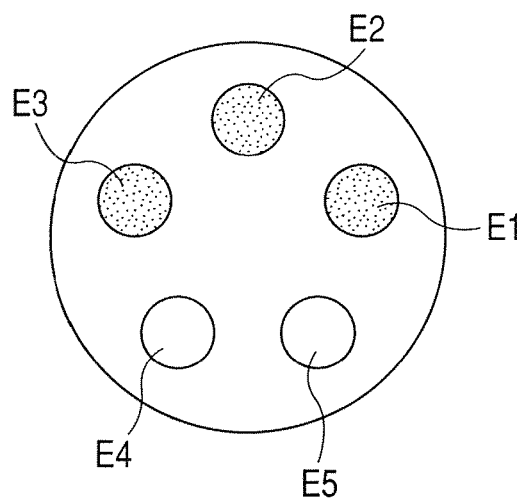
FIG. 5A is a schematic plan view illustrating target electrodes and a state of first and second shutter plates being arranged in association with the target electrodes, in accordance with the present invention.
Figure 5B:
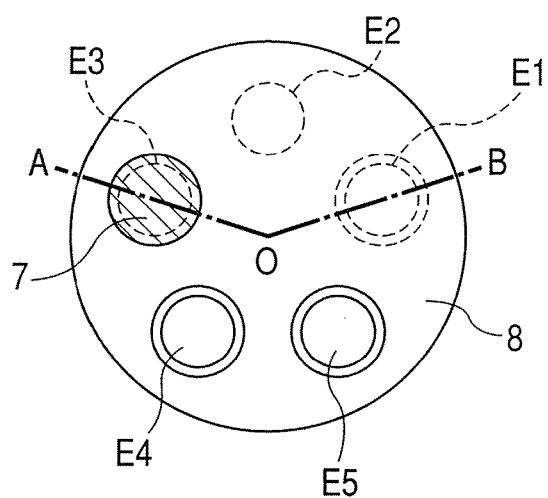
FIG. 5B is another schematic plan view illustrating the target electrodes and a state of the first and second shutter plates being arranged in association with the target electrodes, in accordance with the present invention.
Figure 5C:
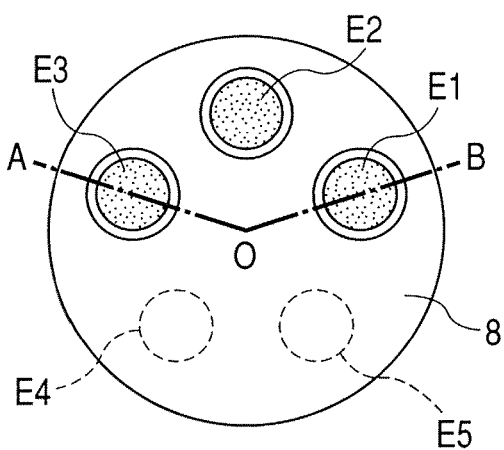
FIG. 5C is yet another schematic plan view illustrating the target electrodes and a state of the first and second shutter plates being arranged in association with the target electrodes, in accordance with the present invention.
Figure 6A:
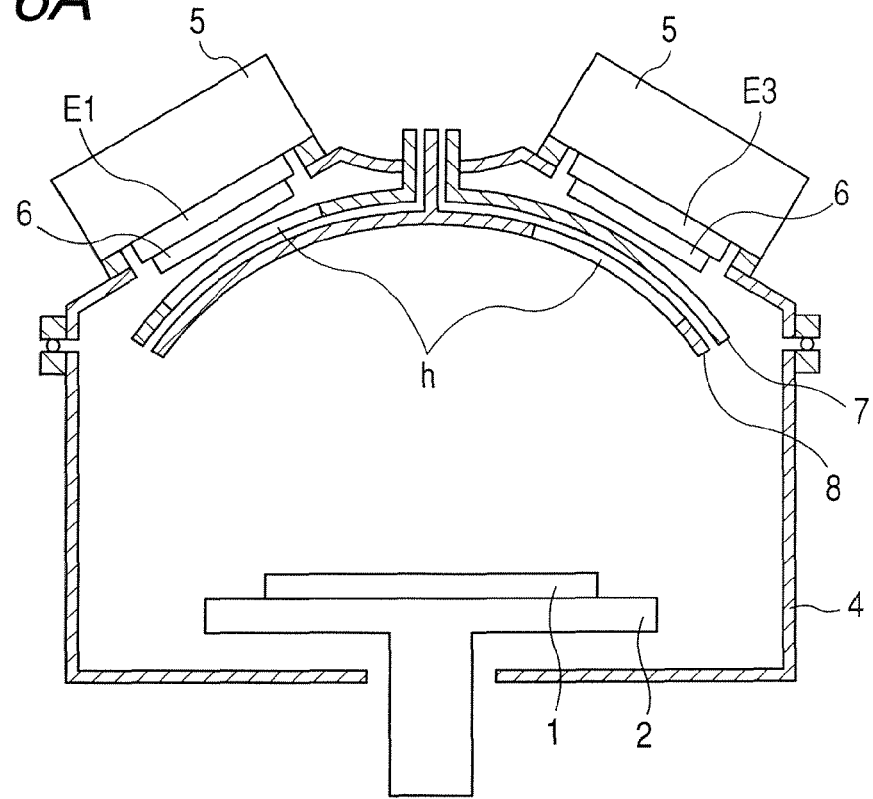
FIG. 6A is a schematic cross-sectional view corresponding to the cross section AOB of FIG. 5B.
Figure 6B:
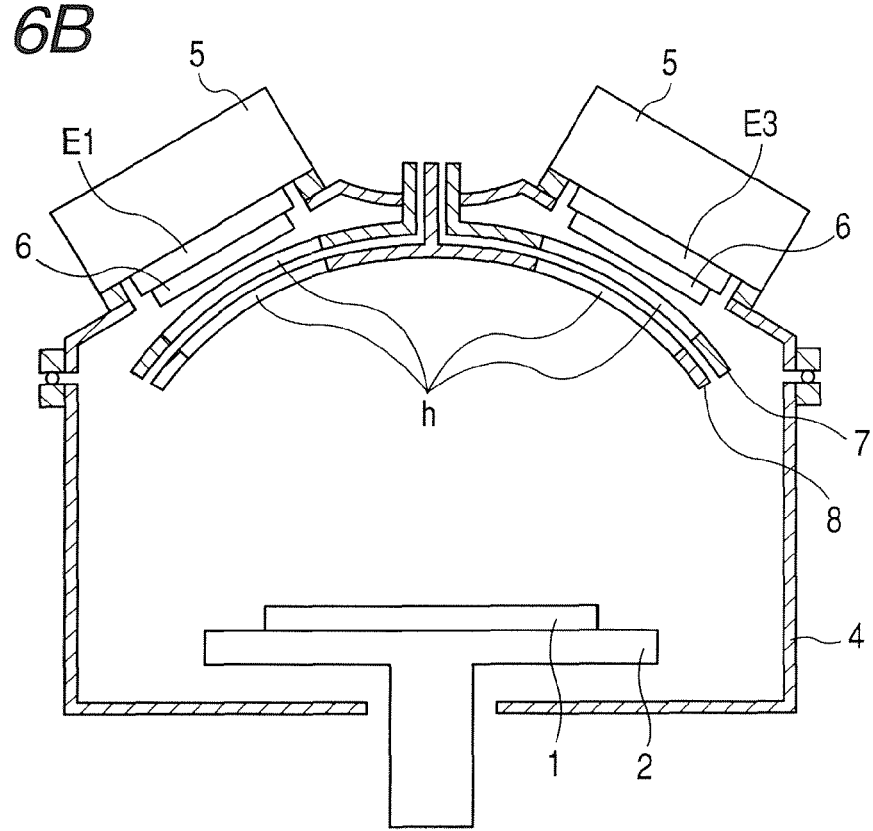
FIG. 6B is a schematic cross-sectional view corresponding to the cross section AOB of FIG. 5C.

Operations performed in a pre-sputtering step and a full-scale sputtering step in the present invention will be described using FIGS. 4 to 7. FIG. 5A is a schematic plan view of a target electrode as viewed from the substrate 1 side, whereas FIGS. 5B and 5C are schematic plan views in which the first and second shutter plates 7 and 8 are arranged one on top of the other and viewed from the substrate 1 side. In addition, FIG. 6A is a schematic cross-sectional view corresponding to the cross-section AOB of FIG. 5B and FIG. 6B is a schematic cross-sectional view corresponding to the cross-section AOB of FIG. 5C. FIG. 7 is a timing chart showing a relationship between the on-off states of the voltages of target electrodes E1 to E5 and the open and closed positions of the first and second shutter plates 7 and 8 in a pre-sputtering step and in a full-scale sputtering step.

In the present embodiment, target arrangement is assumed to be an array of the target electrodes E1, E2 and E3 in which targets are arranged consecutively on the same circumference. As shown in FIG. 5A, the target electrodes E1 to E5 are arranged at an equal angular space of 72° on the same circumference centered on a rotational axis Y.

In a pre-sputtering step, voltages regulated by a power control means (unillustrated) are applied to the target electrodes E1, E2 and E3. Accordingly, paths between targets 6 mounted on the target electrodes E1, E2 and E3 and the substrate 1 need to be shut off, so that particles from targets 6 to be sputtered (hereinafter referred to as "intended targets") mounted on the target electrodes do not reach the substrate 1. The combinations of the first and second shutter plates 7 and 8 for shutting off paths between these targets 6 and the substrate 1 correspond to the pattern shown in FIG. 4B or 4C. In the present embodiment, the pattern of FIG. 4B is assumed.

Upon receipt of input of a timing signal for transition to a pre-sputtering step and target arrangement information from the controller for sputtering 13, the position information-acquiring section 10a of the controller 10 acquires closed-position data (FIG. 4B) appropriate for the target arrangement from the table 10b. That is, the position information-acquiring section 10a refers to the table 10b on the basis of the target arrangement information and acquires data (first closed-position data) used to rotate the first shutter plate 7, so that the through-holes $h_{7-1}$ to $h_{7-3}$ are arranged as shown in the middle figure of FIG. 4B with respect to the target electrodes E1 to E3. In addition, the position information-acquiring section 10a refers to the table 10b on the basis of the target arrangement information and acquires data (second closed-position data) used to rotate the second shutter plate 8, so that the through-holes $h_{8-1}$ to $h_{8-3}$ are arranged as shown in the left-side figure of FIG. 4B with respect to the target electrodes E1 to E3. Then, the controller 10 outputs the first and second closed-position data to the first and second drive means 11 and 12, respectively. The first and second drive means 11 and 12 rotate the first and second shutter plates 7 and 8 to positions corresponding to the above-described closed-position data. Thus, paths between the intended targets 6 and the substrate 1 are shut off by at least one of the first and second shutter plates 7 and 8.

In this way, the controller 10 determines, on the basis of an input pre-sputtering signal, that a pre-sputtering step is to be performed. Accordingly, the controller 10 refers to the table 10b on the basis of input target arrangement information, and acquires appropriate first and second closed-position data. Subsequently, the controller 10 transmits the acquired first and second closed-position data to the first and second drive means, respectively, thereby causing the first and second drive means to perform rotation control appropriate for the closed-position data.

Note that in the pre-sputtering step, the respective through-holes h of the first and second shutter plates 7 and 8 overlap with each other, thereby opening up paths between the target electrodes E4 and E5 and the substrate 1. Accordingly, power supply to the target electrodes E4 and E5 is controlled to an off state by a power control means.

As described above, in the pre-sputtering step, voltages are applied to the target electrodes E1, E2 and E3 with paths between the intended targets 6 and the substrate 1 shut off by the first and second shutter plates 7 and 8. Consequently, the intended targets 6 attached to the target electrodes E1, E2 and E3 are sputtered. Thus, it is possible to remove an oxide film or the like on the surfaces of the targets 6, without allowing particles of the sputtered intended targets 6 to adhere to the substrate 1.

Upon completion of the pre-sputtering step, a transition is made to a full-scale sputtering step. In the full-scale sputtering step, paths between the intended targets 6 attached to the target electrodes E1, E2 and E3 and the substrate 1 need to be opened up. Therefore, the pattern shown in FIG. 4A is input from the table 10b to the first and second drive means 11 and 12 as open-position data. That is, the position information-acquiring section 10a refers to the table 10b on the basis of the target arrangement information and acquires data (first open-position data) used to rotate the first shutter plate 7, so that the through-holes $h_{7-1}$ to $h_{7-3}$ are arranged as shown in the middle figure of FIG. 4A with respect to the target electrodes E1 to E3. In addition, the position information-acquiring section 10a refers to the table 10b on the basis of the target arrangement information and acquires data (second open-position data) used to rotate the second shutter plate 8, so that the through-holes $h_{8-1}$ to $h_{8-3}$ are arranged as shown in the left-side figure of FIG. 4A with respect to the target electrodes E1 to E3. Then, the controller 10 outputs the acquired first and second open-position data to the first and second drive means, respectively. The first and second drive means 11 and 12 rotate the first and second shutter plates 7 and 8 to positions corresponding to the above-described open-position data. As a result, paths between the intended targets 6 and the substrate 1 are opened up as the through-holes h of both the first and second shutter plates 7 and 8 overlap with each other. Thus, particles sputtered out of the intended targets 6 on the target electrodes E1, E2 and E3 reach the substrate 1. Three-target co-sputtering is thus carried out.

In this way, the controller 10 determines, on the basis of an input full-scale sputtering signal, that a full-scale sputtering step is to be performed. Accordingly, the controller 10 refers to the table 10b on the basis of the above-described target arrangement information, and acquires appropriate first and second open-position data. Subsequently, the controller 10 transmits the acquired first and second open-position data to the first and second drive means, respectively, thereby causing the first and second drive means to perform rotation control appropriate for the open-position data. That is, the controller 10 transmits open-position data specific to the first and second drive means, in order to cause the first and second shutter plates 7 and 8 to rotate independently of each other. Thus, the controller 10 controls the positional combination of the through-holes of the first and second shutter plates 7 and 8. At this time, it is possible, in the present invention, to cause the first and second shutter plates 7 and 8 to rotate with no restrictions on each other. Accordingly, the controller 10 can uncover an arbitrary number of target electrodes, among numbers allowed by the combination, to the substrate 1 by controlling the above-described positional combination.

In this way, in the present invention, the controller 10 performs rotation control on the first and second shutter plates 7 and 8 at the time of sputter processing according to the number of intended targets and the arrangement positions thereof, so that all of the intended targets are uncovered to the substrate. That is, the controller 10 controls the rotation of the first and second shutter plates 7 and 8 independently of each other according to the arrangement of desired intended targets, so that the intended targets are uncovered to the substrate (so that the above-described overlapping regions are opposed to the intended targets) through regions in which through-holes formed in the first shutter plate 7 and through-holes formed in the second shutter plate 8 overlap with each other. Consequently, it is possible to alleviate constraints imposed on the number of intended targets and the arrangement positions thereof and improve the degree of freedom of combining intended targets.

Furthermore, in Japanese Patent Application Laid-Open No. 2005-256112 described above, one of the two shutter plates functioning as a cathode-selecting shutter is fixed at the same position and the other shutter plate is repositioned between a pre-sputtering step and a full-scale sputtering step. That is, the technique disclosed in Japanese Patent Application Laid-Open No. 2005-256112 is such that in a pre-sputtering step and in a full-scale sputtering step, one shutter plate is fixed at a predetermined position and the opening up of paths to the substrate is controlled using the other shutter plate alone. Consequently, the combination of the two shutter plates has been limited and the number of targets that can be sputtered simultaneously has been restricted since the above-described one shutter plate is fixed. That is, in the technique disclosed in Japanese Patent Application Laid-Open No. 2005-256112, the position of one shutter plate at the time of executing a pre-sputtering step also influences a full-scale sputtering step and, therefore, the combination of the two shutter plates is limited due to the influence.

In the present invention, however, the controller 10 controls the rotation of the two shutter plates in a pre-sputtering step and in a full-scale sputtering step independently of each other, according to the number of desired intended targets and the arrangement thereof. Accordingly, it is possible to determine the positions of the shutter plates in a full-scale sputtering step, irrespective of the positions of the shutter plates in a pre-sputtering step. Thus, restrictions imposed on the combination of the two shutter plates are alleviated. Consequently, it is possible to improve the degree of freedom concerning the number of intended targets that can be sputtered simultaneously.

Note that in the full-scale sputtering step, paths between the target electrodes E4 and E5 and the substrate 1 are shut off by the first and second shutter plates 7 and 8. Consequently, even if targets 6 are attached to the target electrodes E4 and E5 and voltages are applied to the target electrodes E4 and E5, sputter particles from the targets 6 attached to the target electrodes E4 and E5 do not reach the substrate 1. It is desirable, however, to turn off power supply to unwanted target electrodes E4 and E5, in order to prevent sputter particles from targets 6 not to be sputtered (unintended targets) from mixing with the above-described sputter particles.

When a full-scale sputtering step is completed, particles from the targets 6 are physically blocked by returning the first and second shutter plates 7 and 8 to positions for shutting off paths between the intended targets 6 and the substrate 1 and, at the same time, power to the target electrodes E1, E2 and E3 is turned off.

Figure 14:
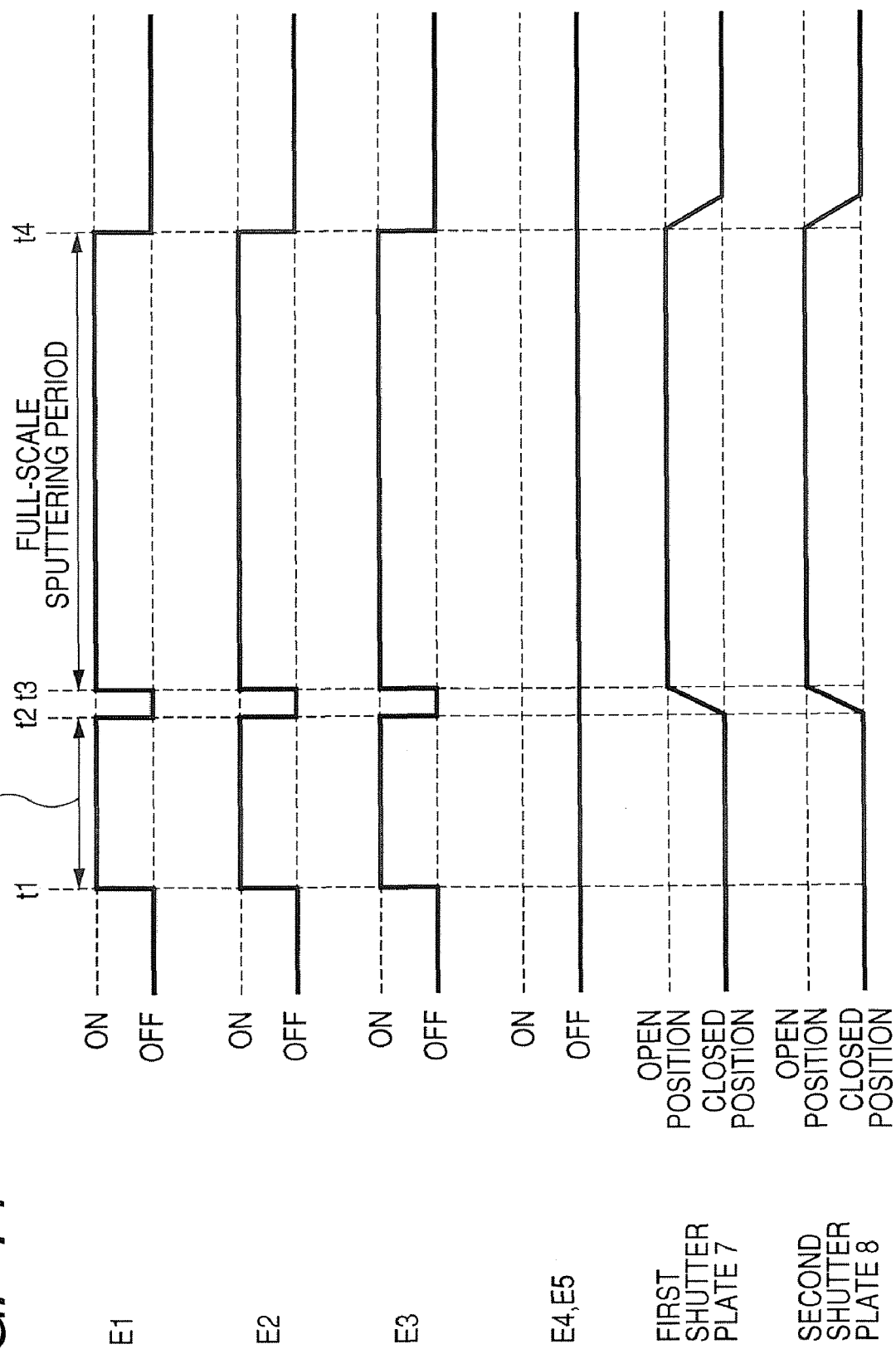
FIG. 14 is an example of another timing chart in accordance with the present invention.

By repeating the above-described pre-sputtering step and full-scale sputtering step, it is possible to film-form a plurality of layers. Note that timing charts are not limited to the one shown in FIG. 7. For example, power to the target electrodes E1 to E3 may be turned off in a period of transition from the pre-sputtering step to the full-scale sputtering step (t2 to t3), as shown in FIG. 14. Consequently, it is possible to more precisely control a film thickness.

Figure 8A:
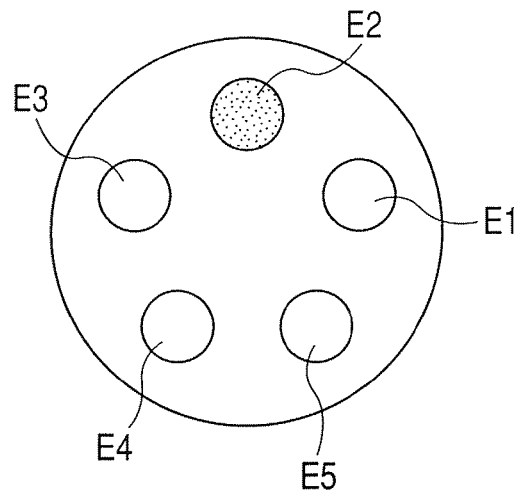
FIG. 8A is a schematic plan view illustrating a positional relationship between the target electrodes and the first and second shutter plates when single-target sputtering is performed in the present invention.
Figure 8B:
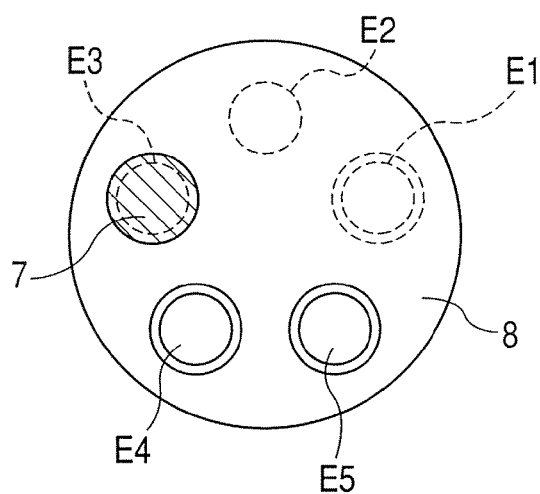
FIG. 8B is another schematic plan view illustrating a positional relationship between the target electrodes and the first and second shutter plates when single-target sputtering is performed in the present invention.
Figure 8C:
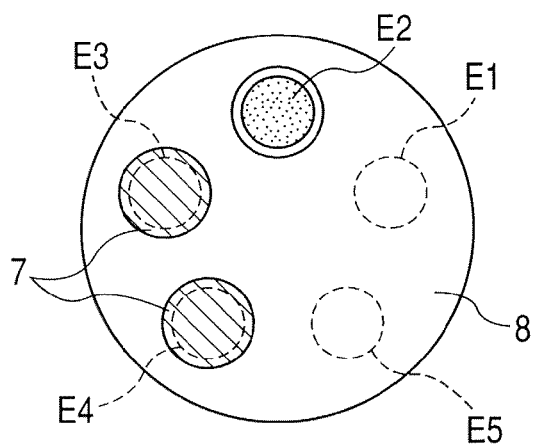
FIG. 8C is yet another schematic plan view illustrating a positional relationship between the target electrodes and the first and second shutter plates when single-target sputtering is performed in the present invention.

While a description has been heretofore made of a case in which three-target co-sputtering is performed in a five-target sputtering apparatus, it is also possible in the sputtering apparatus of the present embodiment to perform two-target co-sputtering or single-target sputtering before or after performing three-target co-sputtering. Specifically, positions in which the through-holes h of the first and second shutter plates 7 and 8 do not overlap in a pre-sputtering step and target arrangements are correlated with each other. In addition, in a full-scale sputtering step, positions in which the through-holes h of the first and second shutter plates 7 and 8 overlap may be correlated with the positions of intended targets. FIGS. 8A to 8C are schematic plan views in which a positional relationship between target electrodes and the first and second shutter plates 7 and 8 is viewed from the substrate 1 side in a case where single-target sputtering is performed by including only the target electrode E2 in a target arrangement. FIG. 8A is a schematic plan view of target electrodes taken from the substrate 1 side, whereas FIGS. 8B and 8C are schematic plan views illustrating a state of the first and second shutter plates 7 and 8 being arranged one on top of the other as viewed from the substrate 1 side. FIG. 8B corresponds to a pre-sputtering step and FIG. 8C corresponds to a full-scale sputtering step. In the present embodiment, only a path between an intended target 6 attached to the target electrode E2 and the substrate 1 is opened up in the full-scale sputtering step. Accordingly, the pattern shown in FIG. 4C is used as a combination of the first and second shutter plates 7 and 8.

Figure 9A:
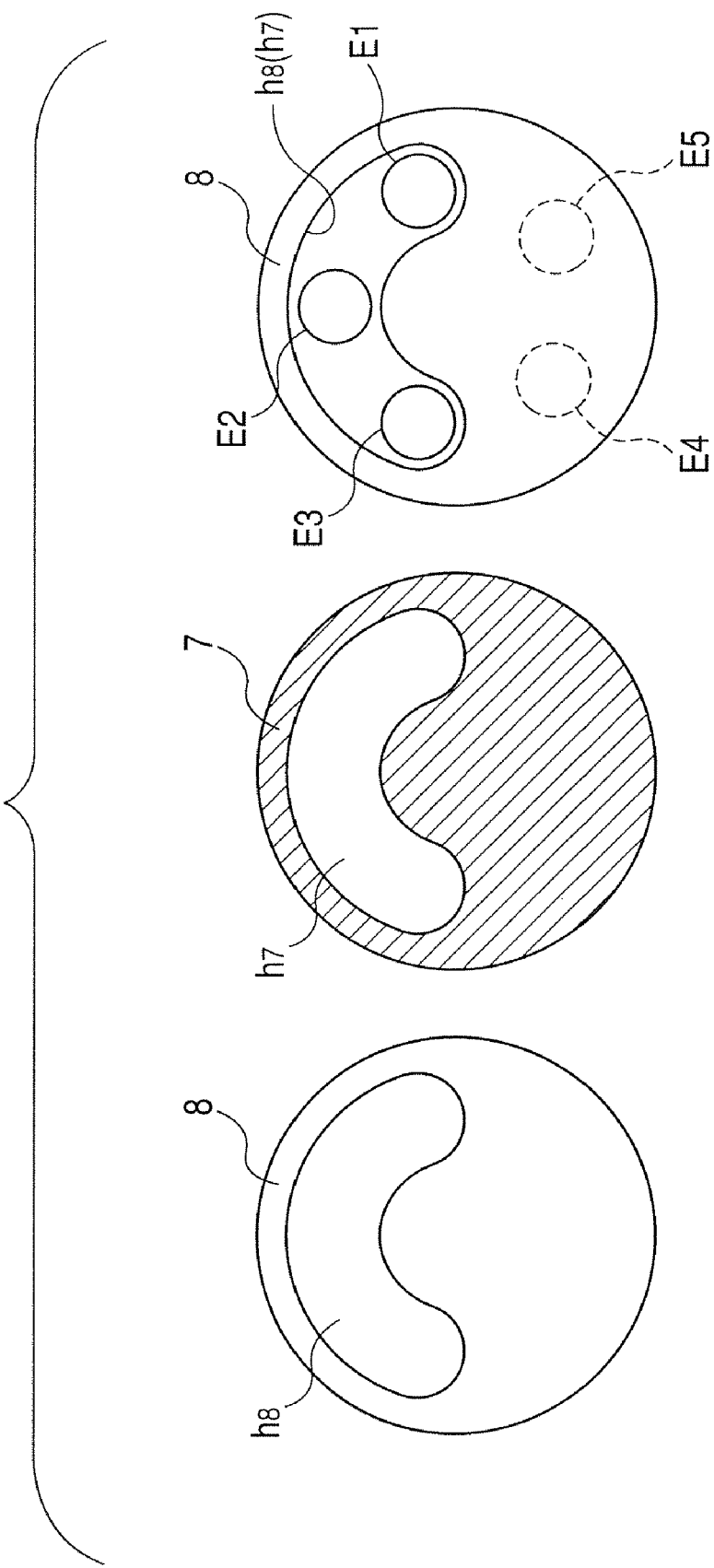
FIG. 9A is a schematic plan view illustrating an example of the shapes of shutter plates in accordance with the present invention.

Note that in the above-described embodiment, an example has been shown, as the shapes of the shutter plates 7 and 8, in which openings are formed by providing a plurality of circular through-holes larger than target electrodes in association therewith. However, the shapes of the shutter plates are not limited to this in the present invention. For example, FIGS. 9A to 9C show an example in which the through-holes $h_7$ and $h_8$ of the shutter plates 7 and 8 of the above-described embodiment are respectively joined together, so that the shutter plates are shaped so as to expose three target electrodes at a time. FIGS. 9A to 9C respectively show, from left to right, conditions in which the shutter plates 7 and 8 are stacked one on top of the other with the second shutter plate 8, the first shutter plate 7, and the second shutter plate 8 positioned on the substrate 1 side, and then viewed therefrom. In FIG. 9A, paths between three target electrodes and the substrate 1 are opened up and paths between two target electrodes and the substrate 1 are shut off. In FIG. 9B, paths between two target electrodes and the substrate 1 are opened up and paths between three target electrodes and the substrate 1 are shut off. In FIG. 9C, a path between one target electrode and the substrate 1 is opened up and paths between two target electrodes and the substrate 1 are shut off. Accordingly, it is possible to perform single-target sputtering through to three-target co-sputtering using the same apparatus by selecting, as appropriate, from the patterns of FIGS. 9A to 9C.

In addition, in the above-described embodiment, there is used a sputtering apparatus in which the target electrodes E1 to E5 are arranged not in parallel but at a tilt with respect to the substrate stage 2, as shown in FIG. 1. However, the present invention is not limited to this arrangement. For example, there may be used a sputtering apparatus in which the target electrodes E1 to E5 and the substrate stage 2 are arranged in parallel with each other, as shown in FIG. 10.

Figure 11A:
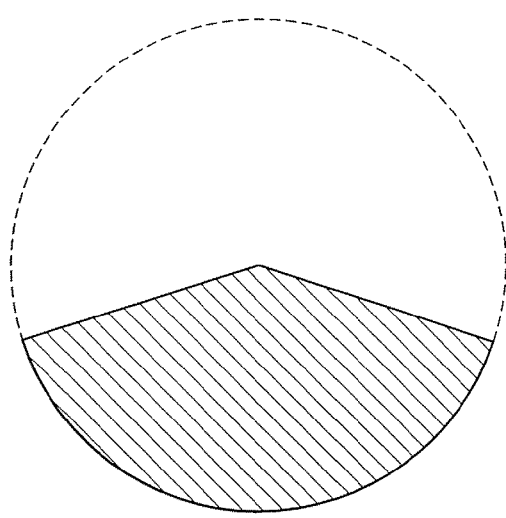
FIG. 11A is still another schematic plan view illustrating an example of the shapes of shutter plates in accordance with the present invention.
Figure 11B:
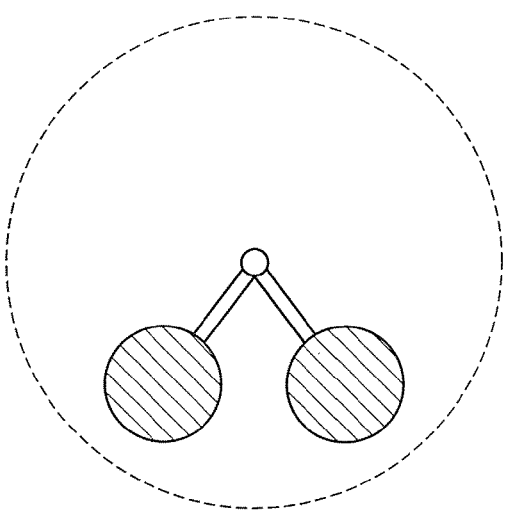
FIG. 11B is still another schematic plan view illustrating an example of the shapes of shutter plates in accordance with the present invention.
Figure 11C:
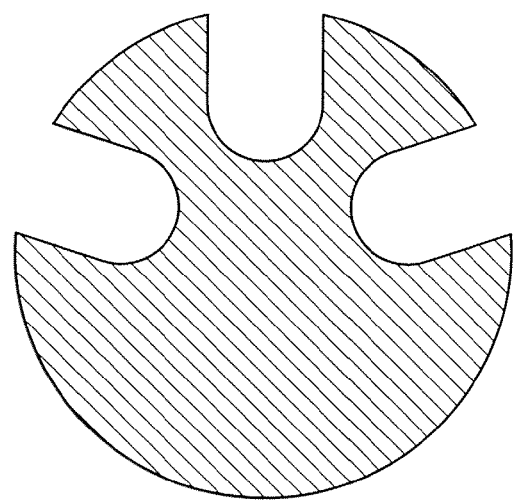
FIG. 11C is still another schematic plan view illustrating an example of the shapes of shutter plates in accordance with the present invention.
Figure 12:
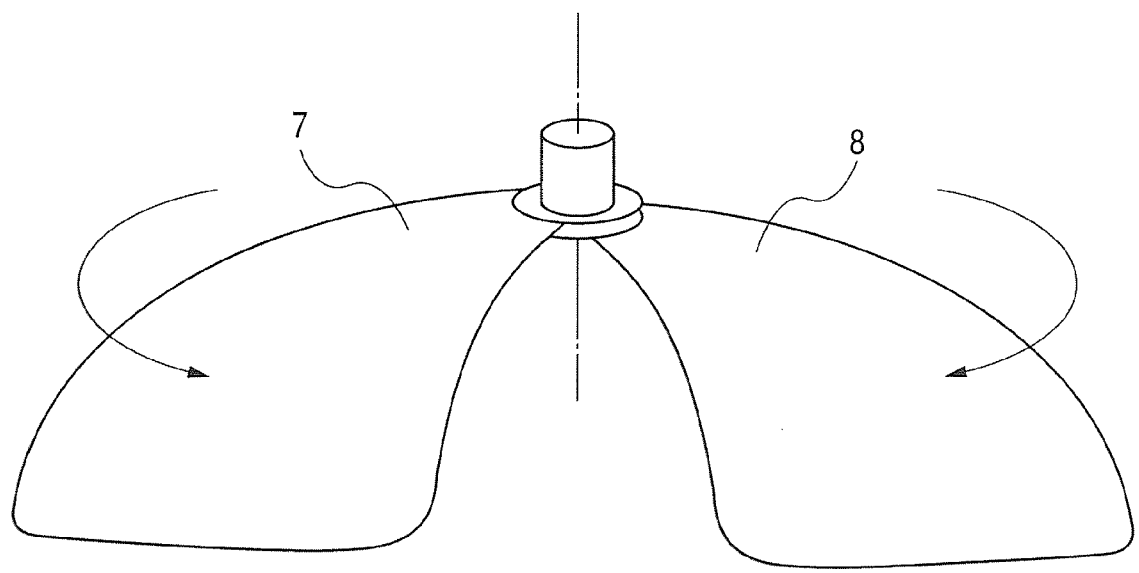
FIG. 12 is still another schematic plan view illustrating an example of the shapes of shutter plates in accordance with the present invention.

Furthermore, FIGS. 11A to 11C are schematic plan views illustrating another example of the shapes of the shutter plates 7 and 8 used in the present invention. FIG. 11A shows an example in which a closing region equivalent to two target electrodes is formed into a sector. FIG. 11B shows an example in which circular closing regions wider than target electrodes are coupled by a support axis, so as to be formed into a ladle-like shape. FIG. 11C shows a shape in which areas between the through-holes of the shutter plates 7 and 8 shown by way of example in FIG. 4 and the outer circumference of the shutter plates are cut out. In addition, FIG. 12 shows an example in which the closing region is formed into a petaline shape.

Figure 13A:
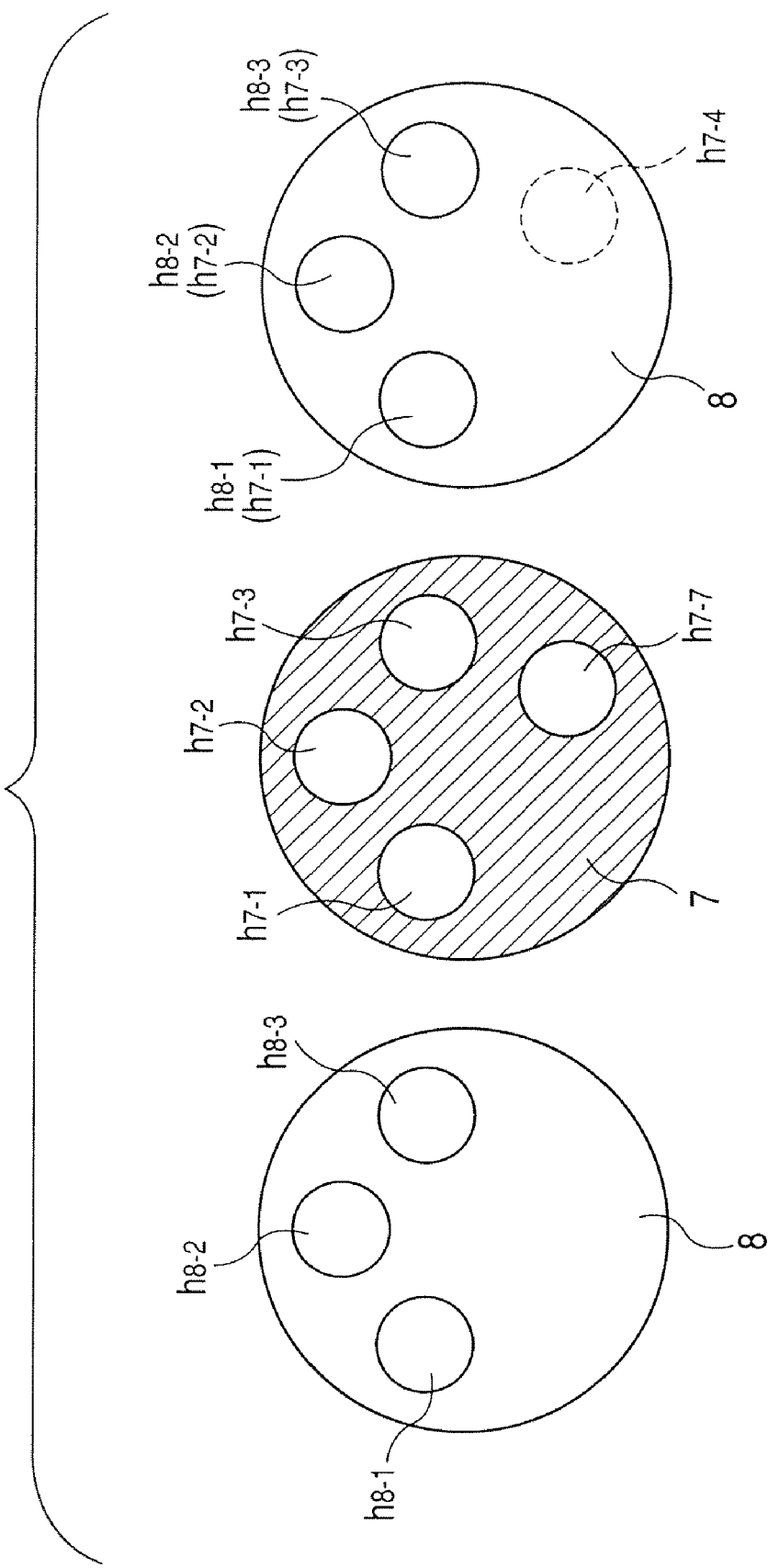
FIG. 13A is a schematic plan view illustrating an example in which the number of through-holes of a shutter plate in accordance with the present invention is changed.
Figure 13B:
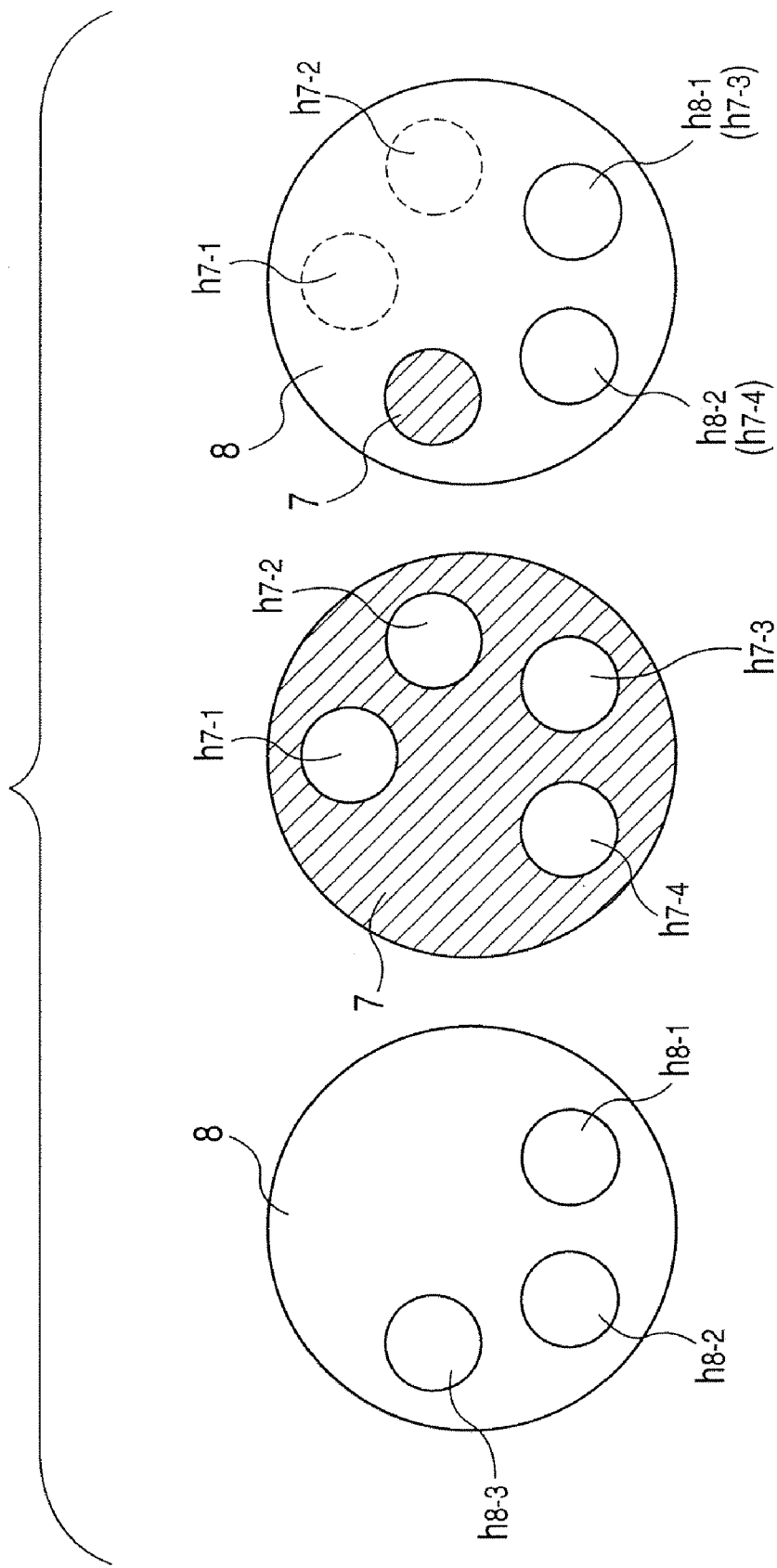
FIG. 13B is another schematic plan view illustrating an example in which the number of through-holes of a shutter plate in accordance with the present invention is changed.

Note that in the present invention, the shutter plates 7 and 8 need not be the same in shape. In addition, the number of target electrodes may be varied in association with openings, or vice versa. For example, in a case where three-target co-sputtering is performed in a five-target sputtering apparatus, the shutter plates 7 and 8 may have shapes in which the closing region of one shutter plate is adapted for two target electrodes and the closing region of the other shutter plate is adapted for one target electrode. FIGS. 13A and 13B show an example in which four through-holes $h_{7-1}$ to $h_{7-4}$ are formed in the first shutter plate 7. In addition, the figures respectively show, from left to right, conditions in which the shutter plates 7 and 8 are stacked one on top of the other with the second shutter plate 8, the first shutter plate 7, and the second shutter plate 8 positioned on the substrate 1 side, and then viewed therefrom.

In FIG. 13A, the positions of each three through-holes $h_{7-1}$ to $h_{7-3}$ and $h_{8-1}$ to $h_{8-3}$ of the first and second shutter plates 7 and 8 overlap with each other. Thus, it is possible to open up paths between each three target electrodes and the substrate 1.

In FIG. 13B, the positions of the through-holes h of the first shutter plate 7 are rotated counterclockwise to 72° from the state of FIG. 13A, thereby shifting the positions one through-hole in a circumferential direction. Consequently, under a condition in which the two shutter plates 7 and 8 are stacked one on top of the other, each two through-holes $h_{7-3}$ and $h_{8-1}$ and $h_{7-4}$ and $h_{8-2}$ overlap with each other. Paths between each two target electrodes and the substrate 1 are therefore opened up. Thus, it is possible to shut off paths between three target electrodes and the substrate 1. Accordingly, a pre-sputtering step may be performed using the pattern of FIG. 13B and a full-scale sputtering step may be performed using the pattern of FIG. 13A at the time of performing three-target co-sputtering.

EXAMPLES

Using the sputtering apparatus shown in FIG. 1, three-target co-sputtering using magnetic targets 6 made respectively of Fe, Co and Ni plates was performed and various Fe—Co—Ni alloy thin films were fabricated.

In the present example, an Si substrate 1, 300 mm in diameter, provided with a thermally-oxidized film was first placed on a substrate stage 2. Then, target electrodes E1 to E5 having a diameter of 180 mm were arranged and disk-shaped targets 6, 180 mm in diameter, were attached thereto. In the present example, the Fe, Co and Ni targets 6 were attached to target electrodes E1, E2 and E3, respectively.

First, a vacuum chamber 4 was roughly evacuated using a dry pump (unillustrated). Then, the dry pump was changed to a cryopump (unillustrated) to evacuate the vacuum chamber 4 up to an ultrahigh vacuum range of $7 \times 10^{-7}$ Pa. After that, an Ar gas was introduced until a pressure of 0.03 Pa was reached, and first and second shutter plates 7 and 8 were arranged in a closed position. Specifically, the shutter plates were arranged as shown in FIG. 5B, according to the combination shown in FIG. 4B. That is, the shutter plates were rotated respectively, so that the through-holes $h_{7-1}$ to $h_{7-3}$ of the first shutter plate 7 were positioned opposite to the target electrodes E1, E4 and E5 and the through-holes $h_{8-1}$ to $h_{8-3}$ of the second shutter plate 8 were positioned opposite to the target electrodes E3, E4 and E5. In this shutter arrangement, the target electrodes E1, E2 and E3 mounted with targets 6 were not exposed. Under this condition, a discharge was initiated by applying power only to the target electrodes E1, E2 and E3 mounted with targets 6 to begin a pre-sputtering step. This pre-sputtering step was maintained for one minute to remove impurities adhering to the surfaces of targets 6.

Next, the first and second shutter plates 7 and 8 were rotated and arranged as shown in FIG. 5C, according to the combination shown in FIG. 4A, thereby opening up paths between the targets 6 and the substrate 1. Specifically, the first shutter plate 7 was rotated counterclockwise to 144° and the second shutter plate 8 was rotated clockwise to 144°, respectively, from the closed position in the page. Thus, the targets 6 attached to the target electrodes E1, E2 and E3 at which discharge had taken place were exposed and full-scale sputtering step was started.

In the manner described above, it was possible to form a Fe—Co—Ni alloy thin film on the Si substrate 1 rotating on the substrate stage 2 located in the lower portion of the vacuum chamber 4. In the present example, the deposition rates of Fe, Co and Ni atoms per 1 W, 1 sec were 0.000156 nm/(W·sec), 0.000191 nm/(W·sec) and 0.000239 nm/(W·sec), respectively. Accordingly, it is possible to adjust the composition of a resultant Fe—Co—Ni alloy thin film by varying a ratio of power applied to the respective target electrodes E1, E2 and E3. Likewise, it is possible to adjust the thickness of a resultant Fe—Co—Ni alloy thin film by varying an exposure time (=film-forming time). Table 1 summarizes applied power and the compositions and thicknesses of resultant Fe—Co—Ni alloy thin films.

TABLE 1

| Sample No. | Power applied to Fe (W) | Power applied to Co (W) | Power applied to Ni (W) | Film-forming time (sec) | Composition ratio of Fe—Co—Ni alloy thin film (atom %) | Thickness of Fe—Co—Ni alloy thin film (nm) |
|---|---|---|---|---|---|---|
| 1 | 500 | 500 | 500 | 600 | 26.6:32.6:40.8 | 175.8 |
| 2 | 710 | 318 | 30 | 560 | 62.0:34.0:4.0 | 100.0 |
| 3 | 180 | 165 | 485 | 114 | 16.0:18.0:66.0 | 20.0 |

Other Embodiments

The present invention may be carried out by building the above-described controller 10 in the sputtering apparatus or by performing the above-described processing of the controller 10 using an apparatus other than the sputtering apparatus. When the processing performed at the controller 10 is carried out using an apparatus other than the sputtering apparatus, the controller 10 may be adapted for use with, for example, information-processing device, such as a computer or an interface device. In this case, the information-processing device and the sputtering apparatus may be interconnected by wired or wireless means, and information characteristic of the present invention (for example, open-position data and closed-position data) may be input from the information-processing device to the sputtering apparatus by way of the above-described interconnection.

A processing method in which a program for operating the configuration of the above-described embodiment is stored in a storage medium, in order to realize the functions of the above-described embodiment, and the program stored in the storage medium is read out as a code and executed on a computer is also included in the scope of the above-described embodiment. That is, computer-readable storage media are also included in the scope of the embodiment. In addition, not only a storage medium in which the above-described computer program is stored but also the computer program itself is included in the above-described embodiment.

As such a storage medium, it is possible to use, for example, a floppy (registered trademark) disk, a hard disk, an optical disk, a magnetooptic disk, a CD-ROM, a magnetic tape, a nonvolatile memory card, or a ROM.

In addition, processing methods are not limited to a method in which processing is executed using the program alone stored in the above-described storage medium. Rather, processing methods that are executed under an operating system in conjunction with the functions of other software and/or an extension board, thereby carrying out the operation of the above-described embodiment, are also included in the scope of the above-described embodiment.

What is claimed is:

1. A sputtering apparatus comprising, within the vacuum chamber thereof, a plurality of target electrodes capable of holding targets and a shut-off device capable of shutting off paths between said target electrodes and a substrate being processed, wherein said plurality of target electrodes are arranged on the same circumference centered on a line perpendicular to and passing through the center of the to-be-treated surface of said substrate being processed, said shut-off device including:

first and second shutter plates that overlap with each other and rotate around the center of the same circumference on which said plurality of target electrodes are arranged;
first and second drive means for rotating said first and second shutter plates independently of each other; and
a drive control means for controlling said first and second drive means;
wherein each of said first and second shutter plates has at least one opening for simultaneously uncovering said plurality of target electrodes to said substrate being processed and has a shape adapted to shut off a path between at least one target electrode and said substrate being processed,
wherein said drive control means can control said first and second drive means so as to rotate said first and second shutter plates independently of each other and, by the positional combination of the openings of said first and second shutter plates, can uncover an arbitrary number of target electrodes, among numbers allowed by said combination, to said substrate being processed, and
wherein at the time of sputter processing in which sputtering is performed by opening up paths between targets to be sputtered and said substrate, said drive control means controls said first and second drive means to rotate said first and second shutter plates independently of each other according to the number of targets to be sputtered and the arrangement thereof, so as to uncover said targets to be sputtered to said substrate being processed through regions in which openings of said first and second shutter plates overlap with each other, so that all of said targets to be sputtered are uncovered to said substrate being processed.

2. The sputtering apparatus according to claim 1, wherein said drive control means further includes a table correlating each arrangement position of said targets to be sputtered with open-position information used to position said openings, so as to uncover said targets to be sputtered to said substrate being processed through openings of both said first and second shutter plates, said drive control means refers to said table upon acquisition of target arrangement information on the arrangement position of said targets to be sputtered, acquires open-position information appropriate for said target arrangement information, and transmits said open-position information to said first and second drive means, and
said first and second drive means rotates said first and second shutter plates independently of each other on the basis of received open-position information, thereby uncovering all of said targets to be sputtered to said substrate being processed.

3. The sputtering apparatus according to claim 1, wherein said drive control means controls said first and second drive means independently of each other, with respect to said sputter processing and pre-sputter processing, which is performed prior to said sputter processing and in which a discharge is initiated with paths between said substrate being processed and said targets to be sputtered shut off by a shutter plate, and said drive control means controls said first and second drive means, so as to rotate said first and second shutter plates independently of each other, so that said first and second shutter plates respectively rotate in said pre-sputter processing to shut off paths between said targets to be sputtered and said substrate being processed.

4. The sputtering apparatus according to claim 3, wherein said drive control means further includes a table correlating each arrangement position of said targets to be sputtered with open-position information used to position said openings, so as to uncover said targets to be sputtered to said substrate being processed through openings of both said first and second shutter plates, and with closed-position information used to position said openings so that paths between said targets to be sputtered and said substrate being processed are shut off by at least one of said first and second shutter plates, at the time of said sputter processing, said drive control means refers to said table upon acquisition of target arrangement information on the arrangement position of said targets to be sputtered, acquires open-position information appropriate for said target arrangement information, and transmits said open-position information to said first and second drive means,
at the time of said pre-sputter processing, said drive control means refers to said table upon acquisition of said target arrangement information, acquires closed-position information appropriate for said target arrangement information, and transmits said closed-position information to said first and second drive means, said first and second drive means rotate said first and second shutter plates independently of each other on the basis of received open-position information, thereby uncovering all of said targets to be sputtered to said substrate being processed, and said first and second drive means rotate said first and second shutter plates independently of each other on the basis of received closed-position information, thereby shutting off paths between said targets to be sputtered and said substrate being processed.

5. The sputtering apparatus according to claim 1, wherein the number of said target electrodes is 2n+1 ("n" is a natural number), and each of said first and second shutter plates has openings adapted for n+1 or more target electrodes.

6. The sputtering apparatus according to claim 1, further including a power control means for turning off power supply to said target electrodes corresponding to unintended targets.

7. The sputtering apparatus according to claim 1, further including a substrate stage rotatable with said substrate being processed mounted thereon, wherein said target electrodes are arranged on the same circumference centered on the rotating center of said substrate stage, and the normal line of each of the surfaces for holding targets of said target electrodes is tilted with respect to the normal line of the to-be-treated surface of said substrate being processed.

8. A method for controlling a sputtering apparatus comprising, within the vacuum chamber thereof, a plurality of target electrodes capable of holding targets and a shut-off device capable of shutting off paths between said target electrodes and a substrate being processed, said plurality of target electrodes being arranged on the same circumference centered on a line perpendicular to and passing through the center of the to-be-treated surface of said substrate being processed, said shut-off device including first and second shutter plates that overlap with each other and rotate around the center of the same circumference on which said plurality of target electrodes are arranged and first and second drive means for rotating said first and second shutter plates independently of each other, each of said first and second shutter plates having a plurality of openings for simultaneously uncovering said plurality of target electrodes to said substrate being processed and having a shape adapted to shut off a path between at least one target electrode and said substrate being processed, wherein said control method can control said first and second drive means so as to rotate said first and second shutter plates independently of each other and, by the positional combination of the openings of said first and second shutter plates, can uncover an arbitrary number of target electrodes, among numbers allowed by said combination, to said substrate being processed, and wherein at the time of sputter processing in which sputtering is performed by opening up paths between targets to be sputtered and said substrate, said control method controls said first and second drive means to rotate said first and second shutter plates independently of each other according to the number of targets to be sputtered and the arrangement thereof, so as to uncover said targets to be sputtered to said substrate being processed through regions in which openings of said first and second shutter plates overlap with each other, so that all of said targets to be sputtered are uncovered to said substrate being processed.

9. The control method according to claim 8, including the steps of:

acquiring target arrangement information on the arrangement position of said targets to be sputtered;

referring to a table correlating each arrangement position of said targets to be sputtered with open-position information used to position said openings, so as to uncover said targets to be sputtered to said substrate being processed through openings of both said first and second shutter plates, acquiring open-position information appropriate for said target arrangement information, and transmitting said open-position information to said first and second drive means.

10. The control method according to claim 8, including the step of controlling said sputtering apparatus, so as to perform, prior to said sputter processing, pre-sputter processing in which a discharge is initiated with paths between said substrate being processed and said targets to be sputtered shut off by a shutter plate, wherein said control method controls said first and second drive means independently of each other with respect to said sputter processing and said pre-sputter processing, and in said pre-sputter processing, said control method controls said first and second drive means, so as to rotate said first and second shutter plates independently of each other, so that said first and second shutter plates respectively rotate to shut off paths between said targets to be sputtered and said substrate being processed.

11. The control method according to claim 10, including the steps of:

acquiring target arrangement information on the arrangement position of said targets to be sputtered;

referring, at the time of said pre-sputter processing, to a table correlating each arrangement position of said targets to be sputtered with closed-position information used to position said openings so that paths between said targets to be sputtered and said substrate being processed are shut off by at least one of said first and second shutter plates, acquiring closed-position information appropriate for said target arrangement information, and transmitting said closed-position information to said first and second drive means; and referring, at the time of said sputter processing, to a table correlating each arrangement position of said targets to be sputtered with open-position information used to position said openings so that said targets to be sputtered are uncovered to said substrate being processed, acquiring open-position information appropriate for said target arrangement information, and transmitting said open-position information to said first and second drive means.

12. A computer program for causing a control method according to claim 8 to be executed by a computer.

13. A storage medium in which a computer-readable program is stored, wherein a computer program according to claim 12 is stored in said storage medium.

* * * * *